US012707841B2

(12) United States Patent
Jung

(10) Patent No.: US 12,707,841 B2
(45) Date of Patent: Aug. 11, 2026

(54) DISPLAY DEVICE

(71) Applicant: Samsung Display Co., LTD., Yongin-si (KR)

(72) Inventor: In Young Jung, Samsung-ro (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 364 days.

(21) Appl. No.: 18/469,192

(22) Filed: Sep. 18, 2023

(65) Prior Publication Data

US 2024/0224656 A1 Jul. 4, 2024

(30) Foreign Application Priority Data

Jan. 2, 2023 (KR) ........................ 10-2023-0000043

(51) Int. Cl.
*H10K 59/131* (2023.01)
*H10K 59/40* (2023.01)

(52) U.S. Cl.
CPC ........... *H10K 59/131* (2023.02); *H10K 59/40* (2023.02)

(58) Field of Classification Search
CPC ............................. H10K 59/131; H10K 59/40
See application file for complete search history.

(56) References Cited

U.S. PATENT DOCUMENTS 7,838,880 B2 * 11/2010 Kwak .................... H10D 86/60 257/E27.111
11,314,369 B2 4/2022 Kim et al.
2024/0164163 A1 * 5/2024 Kim .................... H10K 59/124

FOREIGN PATENT DOCUMENTS

KR 1020170140754 A 12/2017
KR 1020180000046 A 1/2018
KR 1020180023144 A 3/2018

* cited by examiner

*Primary Examiner* — Matthew L Reames
(74) *Attorney, Agent, or Firm* — CANTOR COLBURN LLP

(57) ABSTRACT

A display device includes a substrate, a display area including a transistor including a gate, source and drain electrodes, and a pixel electrode connected to the transistor, and a pad area including a pad electrode including first to third sub-pads which overlap each other and are electrically connected to each other, and in order from the substrate a first conductive layer including the first-sub pad, and the gate, source or drain electrode, a first insulating layer, a second conductive layer including the second sub-pad, and the gate, source or drain electrode, a second insulating layer, a third conductive layer including the third sub-pad, and the gate, source of drain electrode, a third insulating layer, and a fourth conductive layer including the pixel electrode. Within the pad electrode, the second sub-pad and the third sub-pad are in direct contact with each other without the second insulating layer therebetween.

20 Claims, 19 Drawing Sheets

DISPLAY DEVICE

This application claims priority to Korean Patent Application No. 10-2023-0000043 filed on Jan. 2, 2023, and all the benefits accruing therefrom under 35 U.S.C. 119, the contents of which in its entirety are herein incorporated by reference.

BACKGROUND

1. Field

The present disclosure relates to a display device.

2. Description of the Related Art

With the advance of information-oriented society, more and more demands are placed on display devices for displaying images in various ways. For example, display devices are employed in various electronic devices such as smartphones, digital cameras, laptop computers, navigation devices, and smart televisions. The display device may be a flat panel display device such as a liquid crystal display device, a field emission display device and an organic light emitting display device.

Among the flat panel display devices, in the light emitting display device, since each of pixels of a display panel includes a light emitting element capable of emitting light by itself, an image can be displayed without a backlight unit providing light to the display panel.

SUMMARY

Aspects of the present disclosure provide a display device that minimizes a risk of cracking when a circuit board is bonded to a display pad portion.

Aspects of the present disclosure also provide a display device having improved electrical characteristics of the display pad portion.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to an aspect of the present disclosure, a display device includes, a substrate including a display area and a pad area disposed on one side of the display area, a first conductive layer disposed on the substrate, a first insulating layer disposed on the first conductive layer, a second conductive layer disposed on the first insulating layer, a second insulating layer disposed on the second conductive layer, a third conductive layer disposed on the second insulating layer, a third insulating layer disposed on the third conductive layer, and a fourth conductive layer disposed on the third insulating layer, the display device further including, a thin film transistor disposed in the display area, a pixel electrode disposed in the display area and connected to the thin film transistor, and a pad electrode disposed in the pad area, where each of the thin film transistors includes a gate electrode, a source electrode, and a drain electrode which are formed of one of the first conductive layer, the second conductive layer, and the third conductive layer, the pixel electrode is formed of the fourth conductive layer, the pad electrode includes a first sub-pad formed of the first conductive layer, a second sub-pad formed of the second conductive layer, and a third sub-pad formed of the third conductive layer, the first sub-pad, the second sub-pad, and the third sub-pad overlap each other and are electrically connected to each other, and the second sub-pad and the third sub-pad are in direct contact without the second insulating layer interposed therebetween.

The third sub-pad is disposed to completely cover top and side surfaces of the second sub-pad.

In an area overlapping a portion where the first sub-pad and the second sub-pad are in direct contact with each other, the second sub-pad and the third sub-pad are in direct contact with each other.

The third sub-pad has a larger area than the second sub-pad in plan view.

A maximum horizontal length of the third sub-pad is longer than a maximum horizontal length of the second sub-pad.

Thicknesses of the second sub-pad and the third sub-pad are greater than a thickness of the first sub-pad.

The display device may further include, a fifth conductive layer disposed between the third insulating layer and the fourth conductive layer, and a fourth insulating layer disposed between the fifth conductive layer and the fourth conductive layer, where the thin film transistor further includes at least one of a source electrode and a drain electrode, the source and drain electrodes being formed of the fifth conductive layer, the pad electrode further includes a fourth sub-pad disposed on the third sub-pad and formed of the fifth conductive layer, the fourth sub-pad overlaps the first to third sub-pads, the fourth sub-pad is electrically connected to the third sub-pad, and the second to fourth sub-pads are in direct contact without the second insulating layer and the third insulating layer interposed therebetween.

The fourth sub-pad is disposed to completely cover top and side surfaces of the third sub-pad.

In an area overlapping a portion where the first sub-pad and the second sub-pad are in direct contact with each other, the second to fourth sub-pads are in direct contact with each other.

A thickness of the fourth sub-pad is greater than a thickness of the first sub-pad.

The display device may further include, a fifth insulating layer disposed on the fourth conductive layer, a sixth conductive layer disposed on the fifth insulating layer, a first touch electrode disposed on the pixel electrode in the display area, and a first pad layer disposed on a third sub-pad in the pad area, where the first touch electrode and the first pad layer are formed of the sixth conductive layer, the first pad layer overlaps the first to third sub-pads, the first pad layer is electrically connected to the third sub-pad, and the first pad layer is in direct contact with the third sub-pad without the fifth insulating layer interposed therebetween in an area overlapping a portion where the first sub-pad and the second sub-pad are in direct contact with each other.

The first pad layer has a smaller area than the third sub-pad and a larger area than the second sub-pad in plan view.

A maximum horizontal length of the first pad layer is shorter than a maximum horizontal length of the third sub-pad and longer than a maximum horizontal length of the second sub-pad.

The display device may further include a second pad layer disposed between the first pad layer and the third sub-pad and formed of the fifth insulating layer, where the second pad layer is disposed in an area other than an area overlapping a portion where the first sub-pad and the second sub-pad are in direct contact with each other.

The display device may further include, a sixth insulating layer disposed on the sixth conductive layer, and a third pad layer formed of the sixth insulating layer and disposed on the first pad layer, where the third pad layer is disposed in an area other than an area overlapping a portion where the first sub-pad and the second sub-pad are in direct contact with each other.

The display device may further include, a seventh conductive layer disposed on the sixth insulating layer, a second touch electrode formed of the seventh conductive layer in the display area, and a fourth pad layer formed of the seventh conductive layer and disposed on the third pad layer, where the fourth pad layer is electrically connected to the first pad layer, and the fourth pad layer is in direct contact with the first pad layer without the sixth insulating layer interposed therebetween in an area overlapping a portion where the first sub-pad and the second sub-pad are in direct contact with each other.

According to an aspect of the present disclosure, a display device includes, a substrate including a display area and a pad area disposed on one side of the display area, a semiconductor layer disposed in the display area, a gate insulating layer disposed on the semiconductor layer and disposed in the display area and the pad area, a gate electrode disposed in the display area and a first sub-pad disposed in the pad area, the gate electrode and the first sub-pad being disposed on the gate insulating layer, an interlayer insulating layer disposed on the gate electrode and the first sub-pad, a first connection electrode connected to the semiconductor layer in the display area and a second sub-pad disposed on the first sub-pad in the pad area, the first connection electrode and the second sub-pad being disposed on the interlayer insulating layer, a first passivation layer disposed on the first connection electrode in the display area, a second connection electrode disposed on the first passivation layer in the display area and connected to the first connection electrode, and a third sub-pad disposed on the second sub-pad in the pad area, a second passivation layer disposed on the second connection electrode in the display area, and a light emitting element disposed on the second passivation layer, where the first to third sub-pads are respectively disposed on the same layer as the gate electrode, the first connection electrode, and the second connection electrode, and contain the same material, the first to third sub-pads overlap each other and are electrically connected to each other, and the second sub-pad and the third sub-pad are in direct contact without the first passivation layer interposed therebetween.

The third sub-pad is disposed to completely cover top and side surfaces of the second sub-pad.

In an area overlapping a portion where the first sub-pad and the second sub-pad are in direct contact with each other, the second sub-pad and the third sub-pad are in direct contact with each other.

The display device may further include, a touch layer disposed on the light emitting element in the display area and including a touch electrode, and a first pad layer disposed on the third sub-pad in the pad area, where the touch electrode and the first pad layer are disposed on the same layer and contain the same material, the first pad layer and each of the first to third sub-pads overlap each other and are electrically connected to each other, and in an area overlapping a portion where the first sub-pad and the second sub-pad are in direct contact with each other, the first pad layer and the third sub-pad are in direct contact with each other.

According to the display device according to one embodiment of the present disclosure, the risk of cracking when the circuit board is bonded to the display pad portion may be minimized.

According to the display device according to one embodiment of the present disclosure, electrical characteristics of the display pad portion may be improved.

However, effects according to the embodiments of the present disclosure are not limited to those exemplified above and various other effects are incorporated herein.

BRIEF DESCRIPTION OF THE DRAWINGS

The above and other aspects and features of the present disclosure will become more apparent by describing in detail embodiments thereof with reference to the attached drawings, in which.

DETAILED DESCRIPTION

Figure 1:
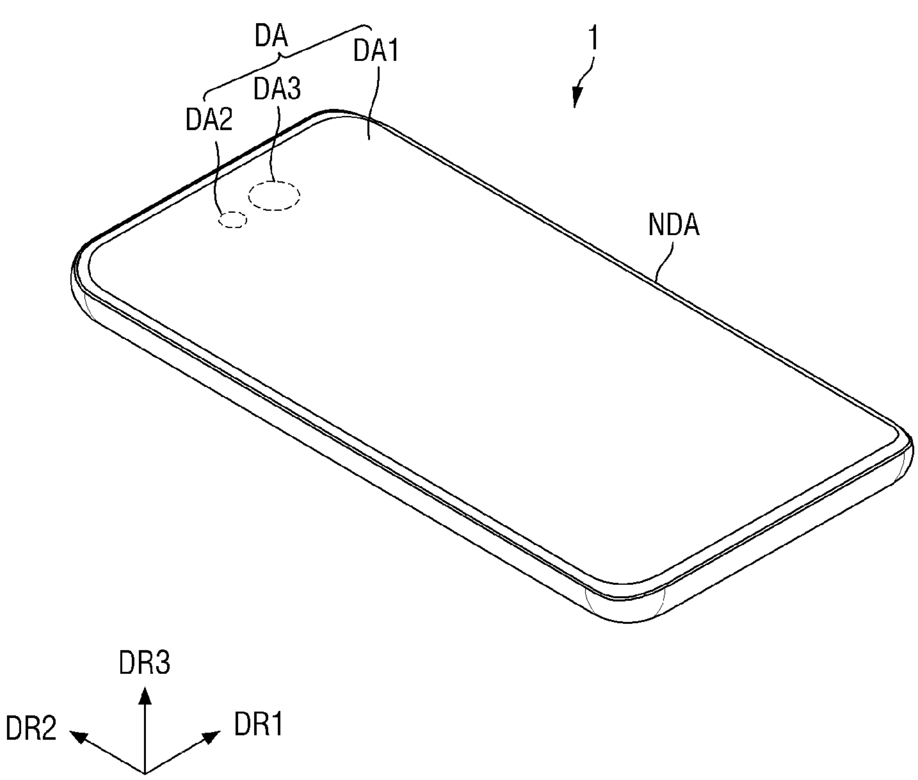
FIG. 1 is a schematic perspective view of an electronic device according to one embodiment.

The invention will now be described more fully hereinafter with reference to the accompanying drawings, in which embodiments of the invention are shown. This invention may, however, be embodied in different forms and should not be construed as limited to the embodiments set forth herein. Rather, these embodiments are provided so that this disclosure will be thorough and complete, and will filly convey the scope of the invention to those skilled in the art.

It will also be understood that when a layer is referred to as being related to another element such as being "on" or "connected to" another layer or substrate, it can be directly on the other layer or substrate, or intervening layers may also be present. In contrast, when a layer is referred to as being related to another element such as being "directly on" or "directly connected to" another layer or substrate, it can be directly on the other layer or substrate, or intervening layers may also be present.

The same reference numbers indicate the same components throughout the specification. Within the Figures and the text of the disclosure, a reference number indicating a singular form of an element may also be used to reference a plurality of the singular element.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments will be described in detail with reference to the accompanying drawings.

FIG. 1 is a schematic perspective view of an electronic device 1 according to one embodiment.

Referring to FIG. 1, an electronic device 1 displays a moving image or a still image. The electronic device 1 may refer to any electronic device providing or having a display screen at which the image is displayed. Examples of the electronic device 1 may include a television, a laptop computer, a monitor, a billboard, an Internet-of-Things device, a mobile phone, a smartphone, a tablet personal computer (PC), an electronic watch, a smart watch, a watch phone, a head-mounted display, a mobile communication terminal, an electronic notebook, an electronic book, a portable multimedia player (PMP), a navigation device, a game machine, a digital camera, a camcorder and the like, which provide a display screen.

The electronic device 1 may include a display device 10 (see FIG. 2) providing or having a display screen. Examples of the display device 10 may include an inorganic light emitting diode display device, an organic light emitting display device, a quantum dot light emitting display device, a plasma display device and a field emission display device. In the following description, a case where an organic light emitting diode display device is applied as a display device 10 will be exemplified, but the present disclosure is not limited thereto, and other display devices 10 may be applied within the same scope of technical spirit.

The shape of the electronic device 1 may be variously modified. For example, the electronic device 1 may have a shape in a plan view (e.g., a planar shape) such as a rectangular shape elongated in a horizontal direction, a rectangular shape elongated in a vertical direction, a square shape, a quadrilateral shape with rounded corners (vertices), other polygonal shapes and a circular shape. The planar shape of a display area DA of the electronic device 1 may also be similar to the overall planar shape of the electronic device 1. FIG. 1 illustrates the electronic device 1 having a rectangular shape elongated in a second direction DR2. As being elongated or extended in a direction, an element may have a major dimension in the direction.

The electronic device 1 may include the display area DA and a non-display area NDA. The display area DA is an area (e.g., a planar area) where a screen can be provided and/or an image is displayed, and the non-display area NDA is an area where a screen is not provided and/or an image is not displayed. The display area DA may also be referred to as an active region, and the non-display area NDA may also be referred to as a non-active region. The display area DA may substantially occupy the center of the electronic device 1, such as to be spaced from an outer edge of the electronic device 1 by respective portions of the non-display area NDA.

The display area DA may include a first display area DA1, a second display area DA2, and a third display area DA3. The second display area DA2 and the third display area DA3 are areas (e.g., planar areas) in which components for adding various functions to the electronic device 1 (e.g., a functional component) are disposed, and the second display area DA2 and the third display area DA3 may correspond to a component area (e.g., a planar area occupied or corresponding to the functional component). Various components or layers of the electronic device 1 may include a display area DA and a non-display area NDA corresponding to those described above.

Figure 2:
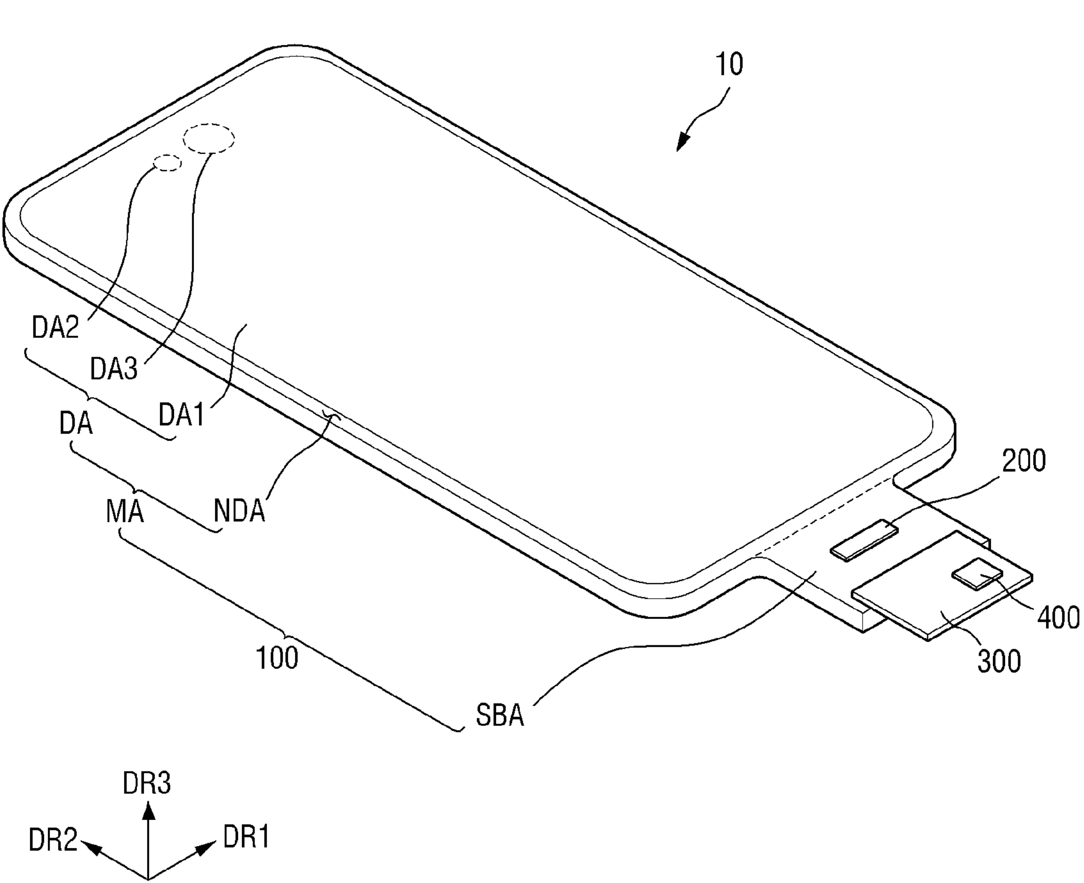
FIG. 2 is a perspective view illustrating a display device included in an electronic device according to one embodiment.

FIG. 2 is a perspective view illustrating a display device 10 included in an electronic device 1 according to one embodiment.

Referring to FIG. 2, the electronic device 1 according to one embodiment may include a display device 10. The display device 10 may provide a screen (e.g., a display screen) of the electronic device 1. The display device 10 may have a planar shape similar to the shape of the electronic device 1. For example, the display device 10 may have a shape similar to a rectangular shape having a short side in (or along) a first direction DR1 and a long side in the second direction DR2, where the first direction DR1 crosses the second direction DR2. The electronic device 1 (or the display device 10) may be disposed in a plane defined by the first direction DR1 and the second direction DR2 crossing each other.

The edge or corner where the short side in the first direction DR1 and the long side in the second direction DR2 meet may be rounded to have a curvature, but is not limited thereto and may be formed at a right angle. The planar shape of the display device 10 is not limited to a quadrilateral shape, and may be formed in a shape similar to another polygonal shape, a circular shape, or elliptical shape in the plan view (e.g., a view of the plane defined by the first direction DR1 crossing the second direction DR2).

In the illustrated figure, the first direction DR1 and the second direction DR2 cross each other as horizontal directions. For example, the first direction DR1 and the second direction DR2 may be orthogonal to each other. In addition, the third direction DR3 crosses each of the first direction DR1 and the second direction DR2, and may be, for example, perpendicular directions orthogonal to each other. In the present specification, directions indicated by arrows of the first to third directions DR1, DR2, and DR3 may be referred to as one side, and the opposite direction may be referred to as the other side.

The display device 10 may include the display panel 100, the display driver 200, the circuit board 300, and the touch driver 400.

The display panel 100 may include a main region MA and a sub-region SBA as an area except for the main region MA.

The main region MA may include the display area DA including pixels PX displaying an image, and the non-display area NDA which is adjacent to the display area DA such as being disposed around the display area DA, in the plan view. The display area DA may include the first display area DA1, the second display area DA2, and the third display area DA3. The display area DA may emit light from a plurality of emission areas and/or a plurality of opening areas, to display an image. For example, the display panel 100 may include a pixel circuit including switching elements, a pixel defining layer (e.g., a bank layer BKL) defining an emission area or an opening area, and a self-light emitting element.

For example, the self-light emitting element as a light emitting element may include at least one of an organic light emitting diode (LED) including an organic light emitting layer, a quantum dot LED including a quantum dot light emitting layer, an inorganic LED including an inorganic semiconductor, and a micro LED, but is not limited thereto.

The non-display area NDA may be an area outside of the display area DA, that is, further from a center of the electronic device 1 or closer to the outer edge thereof. The non-display area NDA may be defined as an edge area of the main region MA of the display panel 100. A boundary may be defined between the display area DA and the non-display area NDA.

The non-display area NDA may include a gate driver 210 (see FIG. 4) that supplies gate signals to the gate lines GL in the display area DA, and fan-out lines FOL (see FIG. 4) that connect the display driver 200 to the display area DA.

The sub-region SBA may be a region extending from one side of the main region MA. The sub-region SBA may include a flexible material which is bendable, foldable or rollable such that the electronic device 1 (or the display device 10) can be bent, folded or rolled at the sub-region SBA. For example, when the electronic device 1 is bent at the sub-region SBA, the sub-region SBA may overlap the main region MA in a thickness direction (e.g., a third direction DR3). The sub-region SBA may include the display driver 200 and a pad portion which is connected to the circuit board 300. In an embodiment, the sub-region SBA may be omitted, and the display driver 200 and the pad portion may be arranged in the non-display area NDA of the main region MA.

The display driver 200 may output signals and voltages as electrical signals for driving the display panel 100. The display driver 200 may supply data voltages to data lines DL in the display area DA. The display driver 200 may supply a power voltage to the power line PL and may supply a gate control signal to the gate driver 210. The display driver 200 may be formed as an integrated circuit (IC) and mounted on the display panel 100 by a chip on glass (COG) method, a chip on plastic (COP) method, or an ultrasonic bonding method. For example, the display driver 200 may be disposed in the sub-region SBA. The electronic device 1 (or the display device 10 or the display panel 100) which is bent at the sub-region SBA may dispose the sub-region SBA overlapping the main region MA in the thickness direction. For another example, the display driver 200 may be mounted on the circuit board 300.

Figure 10:
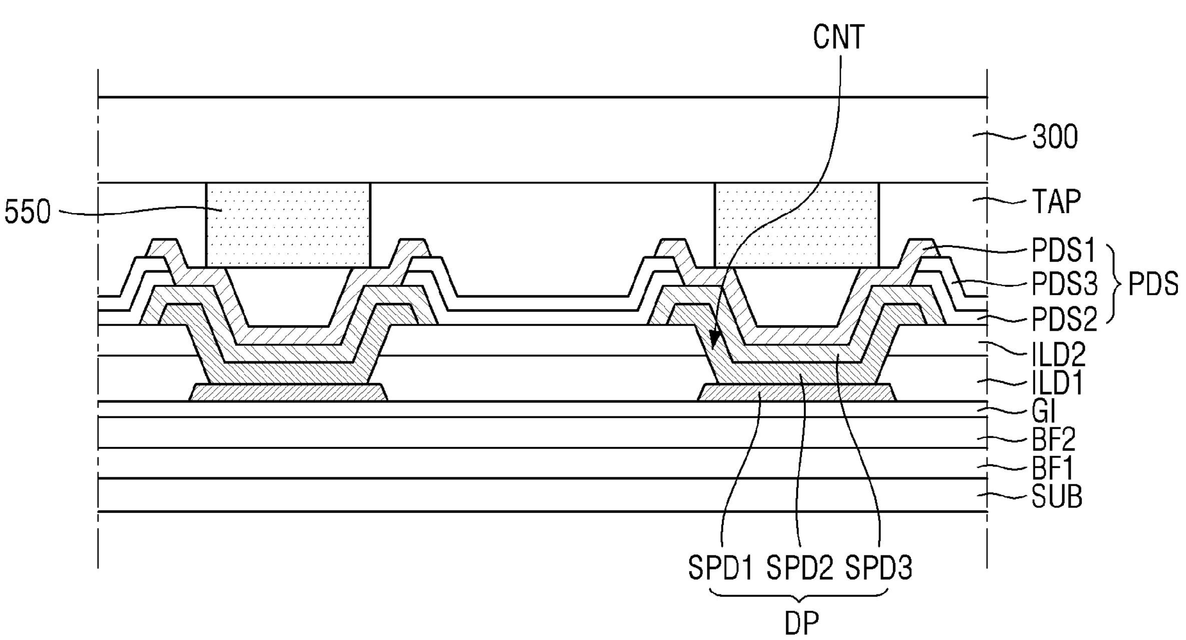
FIG. 10 is an enlarged cross-sectional view illustrating a pad area of a display device and a circuit board disposed thereon according to one embodiment.

The circuit board 300 may be attached to the pad portion of the display panel 100, such as by using the adhesive member TAP (see FIG. 10). For example, the adhesive member TAP may be a non-conductive film (NCF). For another example, the adhesive member TAP may be an anisotropic conductive film (ACF) or a self assembly anisotropic conductive paste (SAP).

Lead lines of the circuit board 300 may be electrically connected to the display panel 100 at a pad portion of the display panel 100. The circuit board 300 may be a flexible printed circuit board, a printed circuit board, or a flexible film such as a chip on film. The circuit board 300 is a component external to the display panel 100, within the electronic device 1.

A touch driver 400 may be mounted on the circuit board 300. The touch driver 400 may be connected to a touch sensing unit of the display panel 100, via the circuit board 300. The touch driver 400 may supply a touch driving signal as an electrical signal to a plurality of touch electrodes of the touch sensing unit and may sense an amount of change in capacitance between the plurality of touch electrodes. For example, the touch driving signal may be a pulse signal having a predetermined frequency. The touch driver 400 may calculate whether an external input is made to the electronic device 1 and input coordinates of the external input based on an amount of change in capacitance between the plurality of touch electrodes. The touch driver 400 may be formed of an integrated circuit (IC).

Figure 3:
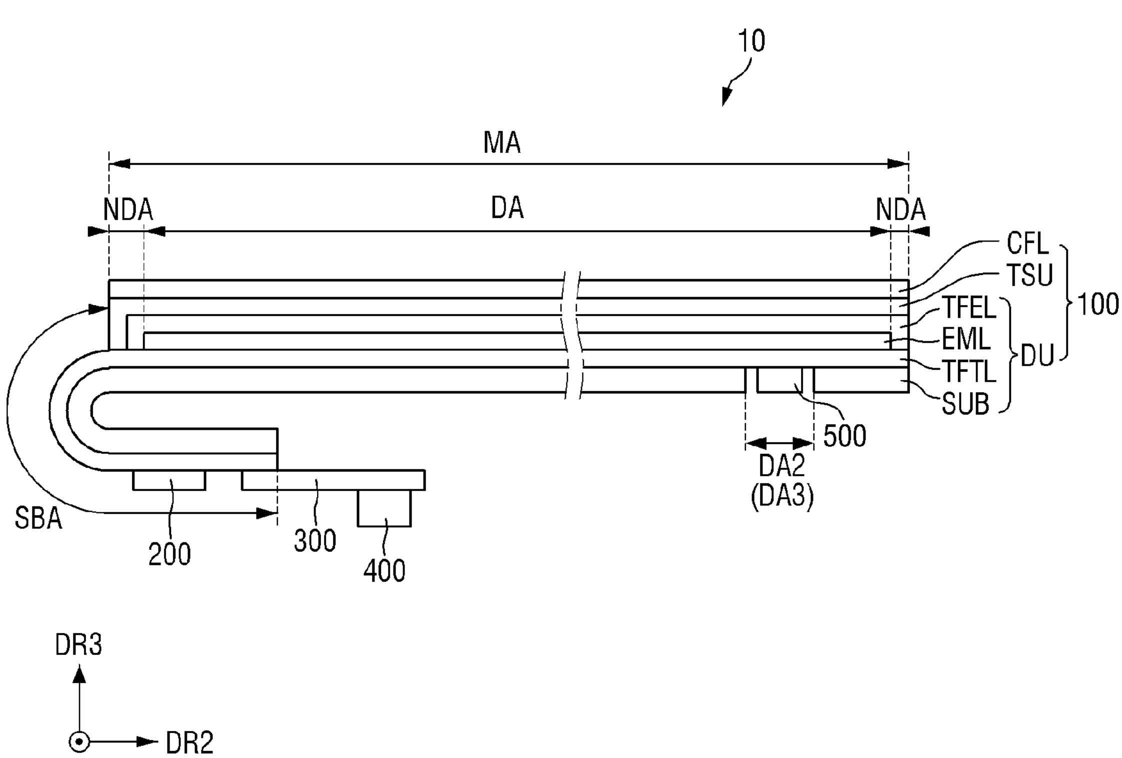
FIG. 3 is a cross-sectional view of the display device of FIG. 2 viewed from the side.

FIG. 3 is a cross-sectional view of the display device 10 of FIG. 2 viewed from the side.

Referring to FIG. 3, the display panel 100 may include a display layer DU at which light is generated and/or emitted, an image is displayed, etc., a touch sensing layer TSU (e.g., a touch layer or touch sensor), and a color filter layer CFL. The display layer DU may include a substrate SUB, a thin film transistor layer TFTL (e.g., a circuit layer), a light emitting element layer EML, and a thin film encapsulation layer TFEL.

The substrate SUB may be a base substrate or a base member. The substrate SUB may be a flexible substrate which is bendable, foldable or rollable such as to be bent, folded or rolled. For example, the substrate SUB may include a polymer resin such as polyimide (PI), but is not limited thereto. In an embodiment, the substrate SUB may include a glass material or a metal material.

The thin film transistor layer TFTL may be disposed on the substrate SUB. The thin film transistor layer TFTL may include a plurality of thin film transistors TFT constituting a pixel circuit of pixels PX. The thin film transistor layer TFTL may further include gate lines GL, data lines DL, power lines VL, gate control lines GCL, fan-out lines FOL connecting the display driver 200 and the data lines DL, and lead lines connecting the display driver 200 and the pad portion, illustrated in FIG. 4. Each of the thin film transistors TFT may include a semiconductor region, a source electrode, a drain electrode, and a gate electrode. For example, when the gate driver 210 is formed on one side of the non-display area NDA of the display panel 100, the gate driver 210 may include thin film transistors TFT.

The thin film transistor layer TFTL may be disposed in the display area DA, the non-display area NDA, and the sub-region SBA. Thin film transistors TFT, gate lines GL, data lines DL, and power lines VL of each of the pixels PX of the thin film transistor layer TFTL may be disposed in the display area DA. Gate control lines GCL and fan-out lines FOL of the thin film transistor layer TFTL may be disposed in the non-display area NDA. The lead lines of the thin film transistor layer TFTL may be disposed in the sub-region SBA.

The light emitting element layer EML may be disposed on the thin film transistor layer TFTL. The light emitting element layer EML may include a plurality of light emitting elements each including a first electrode, a second electrode, and a light emitting layer to emit light, and a pixel defining layer (e.g., a bank layer BKL) defining pixels PX. The plurality of light emitting elements of the light emitting element layer EML may be disposed in the display area DA.

The thin film encapsulation layer TFEL may cover the top surface and the side surface of the light emitting element layer EML, and may protect the light emitting element layer EML. The thin film encapsulation layer TFEL may include at least one inorganic layer and at least one organic layer for encapsulating the light emitting element layer EML.

The touch sensing layer TSU may be disposed on the encapsulation layer TFEL. The touch sensing layer TSU may include a plurality of touch electrodes for sensing an external input such as from a user's touch in a capacitive manner, and touch lines connecting the plurality of touch electrodes to the touch driver 400. For example, the touch sensing layer TSU may sense the user's touch by using a mutual capacitance method or a self-capacitance method.

In an embodiment, the touch sensing layer TSU may be disposed on a separate substrate disposed on the display layer DU. In this case, the separate substrate supporting the touch sensing layer TSU may also function as a base member that encapsulates the display layer DU.

The plurality of touch electrodes of the touch sensing layer TSU may be disposed in a touch sensor area overlapping (or corresponding to) the display area DA. The touch lines of the touch sensing layer TSU may be disposed in a touch peripheral area that overlaps (or corresponds to) the non-display area NDA.

The color filter layer CFL may be disposed on the touch sensing layer TSU. The color filter layer CFL may include a plurality of color filters respectively corresponding to the plurality of emission areas (e.g., light emission areas). Each of the color filters may selectively transmit light of a specific wavelength and may block or absorb light of a different wavelength. The color filter layer CFL may absorb a part of light coming from outside of the display device 10 (e.g., as external light) to reduce reflected light due to the external light. Accordingly, the color filter layer CFL may prevent color distortion caused by reflection of the external light.

Since the color filter layer CFL is directly disposed on the touch sensing layer TSU, the display device 10 may not require a separate substrate for the color filter layer CFL. Accordingly, the overall thickness of the display device 10 may be relatively small.

Figure 4:
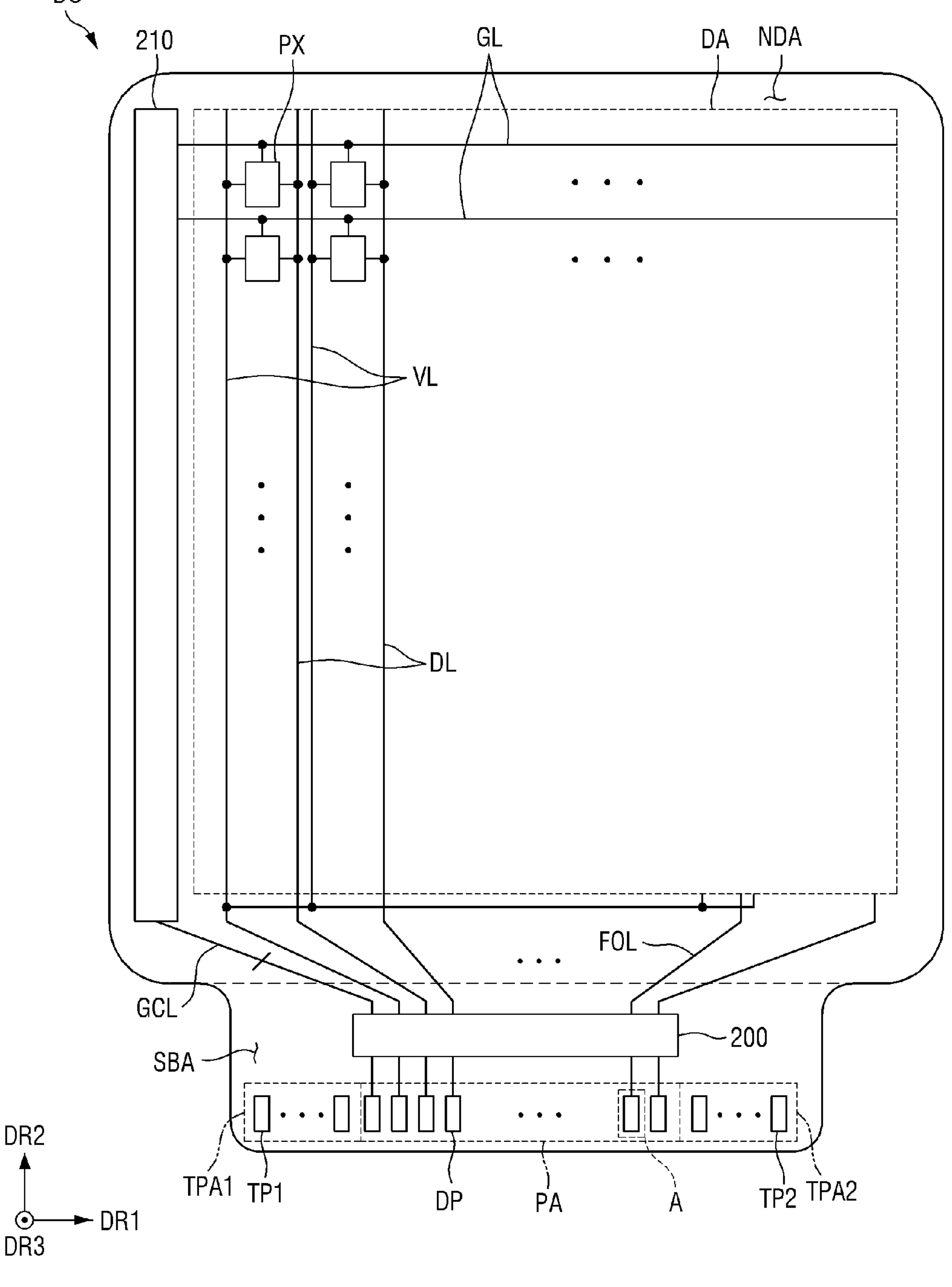
FIG. 4 is a plan view illustrating a display layer of a display device according to one embodiment.

FIG. 4 is a plan view illustrating a display layer DU of a display device according to one embodiment.

Referring to FIG. 4, the display layer DU may include the display area DA and the non-display area NDA.

The display area DA may be disposed at the center of the display panel 100. A plurality of pixels PX, a plurality of gate lines GL, a plurality of data lines DL, and a plurality of power lines VL may be disposed in the display area DA. Each of the plurality of pixels PX may be defined as a minimum unit of the display device 10 that emits light.

The plurality of gate lines GL may supply the gate signals received from the gate driver 210 to the plurality of pixels PX. The plurality of gate lines GL may extend in the first direction DR1 and may be spaced apart from each other in the second direction DR2 intersecting the first direction DR1.

The plurality of data lines DL may supply the data voltages received from the display driver 200 to the plurality of pixels PX. The plurality of data lines DL may extend in the second direction DR2 and may be spaced apart from each other in the first direction DR1.

The plurality of power lines VL may supply the power voltage received from the display driver 200 to the plurality of pixels PX. Here, the power voltage may be an electrical as at least one of a driving voltage, an initialization voltage, a reference voltage, and a low potential voltage. The plurality of power lines VL may extend in the second direction DR2 and may be spaced apart from each other in the first direction DR1.

The non-display area NDA may extend along sides of the display area DA such as to surround the display area DA. The gate driver 210, the fan-out lines FOL, and the gate control lines GCL may be disposed in the non-display area NDA. The gate driver 210 may generate a plurality of gate signals based on the gate control signal, and may sequentially supply the plurality of gate signals to the plurality of gate lines GL according to a set order.

The fan-out lines FOL may extend from the display driver 200 to the display area DA. The fan-out lines FOL may supply the data voltage received from the display driver 200 to the plurality of data lines DL.

The gate control line GCL may extend from the display driver 200 to the gate driver 210. The gate control line GCL may supply the gate control signal received from the display driver 200 to the gate driver 210.

The sub-region SBA may include the display driver 200, a pad area PA, and first and second touch pad areas TPA1 and TPA2. The first touch pad area TPA1 includes a first touch pad TP1 provided in plural as a plurality of first touch pads TP1, and the second touch pad area TPA2 includes a second touch pad TP2 provided in plural as a plurality of second touch pads TP2.

The display driver 200 may output signals and voltages for driving the display panel 100 to the fan-out lines FOL. The display driver 200 may supply a data voltage to the data line DL through the fan-out lines FOL. The data voltage may be supplied to the plurality of pixels PX, and the luminance of the plurality of pixels PX may be controlled, such as to display an image. The display driver 200 may supply the gate control signal to the gate driver 210 through the gate control line GCL.

The pad area PA, the first touch pad area TPA1, and the second touch pad area TPA2 may be disposed at the edge of the sub-region SBA which defines an edge of the display panel 100. The display panel 100 may be electrically connected to the circuit board 300 at each of the pad area PA, the first touch pad area TPA1, and the second touch pad area TPA2, such as by using the adhesive member TAP (see FIG. 10). In an embodiment, a connecting member such as the adhesive member TAP may physically and electrically connect the circuit board 300 to each of the display pads of the pad area PA, the first touch pads TP1 of the first touch pad area TPA1 and the second touch pads TP2 of the second touch pad area TPA2.

The pad area PA may include a plurality of display pad portions DP (e.g., a display pad provided in plural including a plurality of display pads). The plurality of display pad portions DP may be connected to a graphic system through the circuit board 300. The plurality of display pad portions DP may be connected to the circuit board 300 to receive digital video data, and may supply the digital video data to the display driver 200.

In some embodiments, although not illustrated, an area such as the pad area PA (e.g., a first pad area) may be further included under the display driver 200 as a second pad area. When the display driver 200 is formed of (or provided as) an integrated circuit (IC) and mounted on the display panel 100 or the circuit board 300, the planar area disposed under the display driver 200 may include the plurality of display pad portions DP like the pad area PA. Descriptions of the pad area PA, the display pad portion DP, a pad structure PDS, and the like in the present specification may also be equally applied to the second pad area disposed below the display driver 200.

Figure 5A:
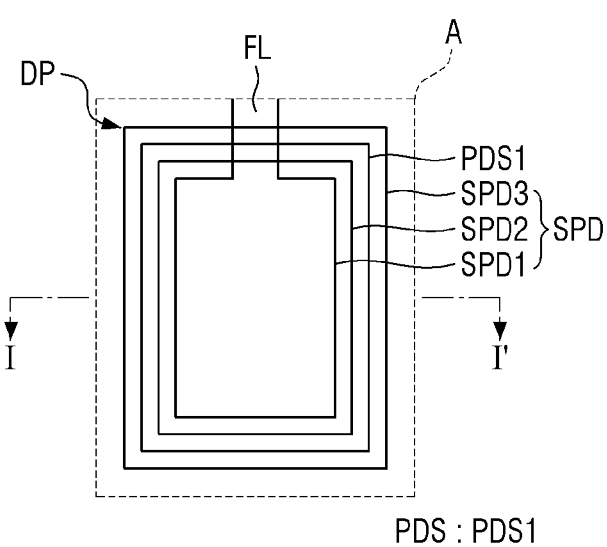
FIGS. 5A, 5B and 5C are enlarged views of area A of FIG. 4.
Figure 5B:
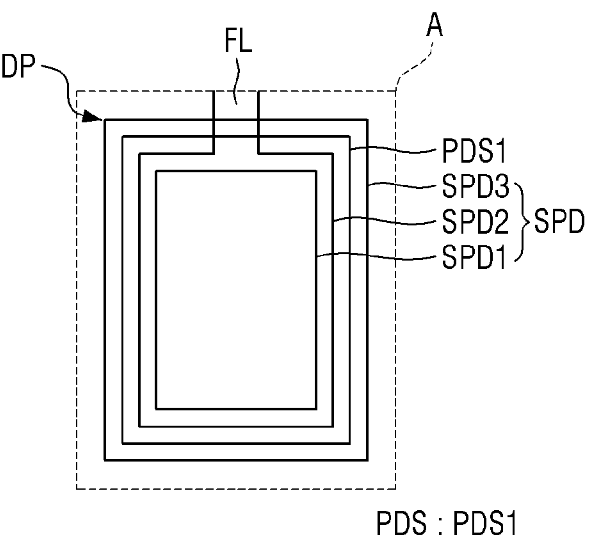
Figure 5C:
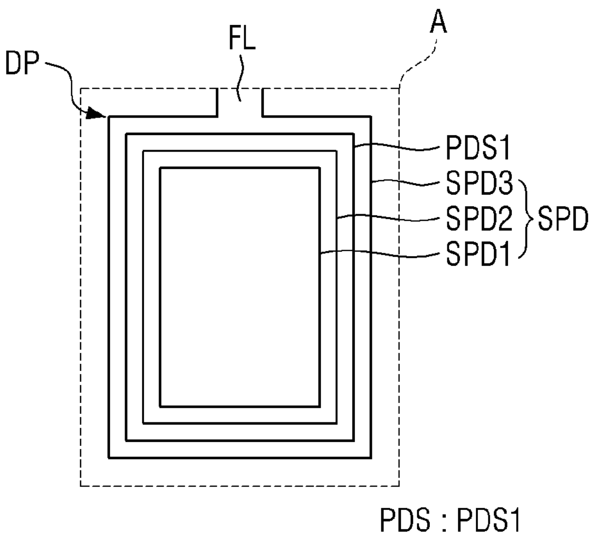

FIGS. 5A, 5B and 5C are enlarged plan views of area A of FIG. 4. One or more view among FIGS. 5A, 5B and 5C are hereinafter referred to as "FIG. 5" for convenience of description. FIG. 5 is an enlarged view of the display pad portion DP. A fan-out line FL may be an end portion of a lead line among the fan-out lines FOL in FIG. 4, without being limited thereto.

Referring to FIG. 5, the display pad portion DP may include a sub-pad SPD and the pad structure PDS. The sub-pad SPD may include a first sub-pad SPD1 (e.g., a first sub-pad portion), a second sub-pad SPD2 (e.g., a second sub-pad portion), and a third sub-pad SPD3 (e.g., a third sub-pad portion). The pad structure PDS may include a first pad layer PDS1. In one embodiment, the second sub-pad SPD2 may be disposed on the first sub-pad SPD1 and may be disposed on the third sub-pad SPD3, and the first pad layer PDS1 may be disposed on the third sub-pad SPD3.

In some embodiments, as illustrated in the drawing, the area (e.g., the planar area) of the first sub-pad SPD1 may be smaller than the area of the second sub-pad SPD2 in plan view, the area of the second sub-pad SPD2 may be smaller than the area of the first pad layer PDS1 in plan view, and the area of the first pad layer PDS1 may be smaller than the area of the third sub-pad SPD3 in plan view.

In the embodiment of FIG. 5A, the first sub-pad SPD1 may be connected to the fan-out line FL (or lead line). The first sub-pad SPD1 may be a distal end of the fan-out line FL which has an increased planar area than portions of the fan-out line FL. In this case, the fan-out line FL may be disposed in a same layer as the first sub-pad SPD1. As being in a same layer, elements may be formed in a same process and/or include a same material as each other, elements may be respective portions of a same material layer, elements may be on a same layer by forming an interface with a same underlying or overlying layer, etc., without being limited thereto.

In the embodiment of FIG. 5B, the second sub-pad SPD2 may be connected to the fan-out line FL. In this case, the fan-out line FL may be disposed in the same layer as the second sub-pad SPD2.

In the embodiment of FIG. 5C, the third sub-pad SPD3 may be connected to the fan-out line FL. In this case, the fan-out line FL may be disposed in the same layer as the third sub-pad SPD3.

A detailed description of the sub-pad SPD and the pad structure PDS will be described later with reference to FIG. 8 and the like.

Figure 6:
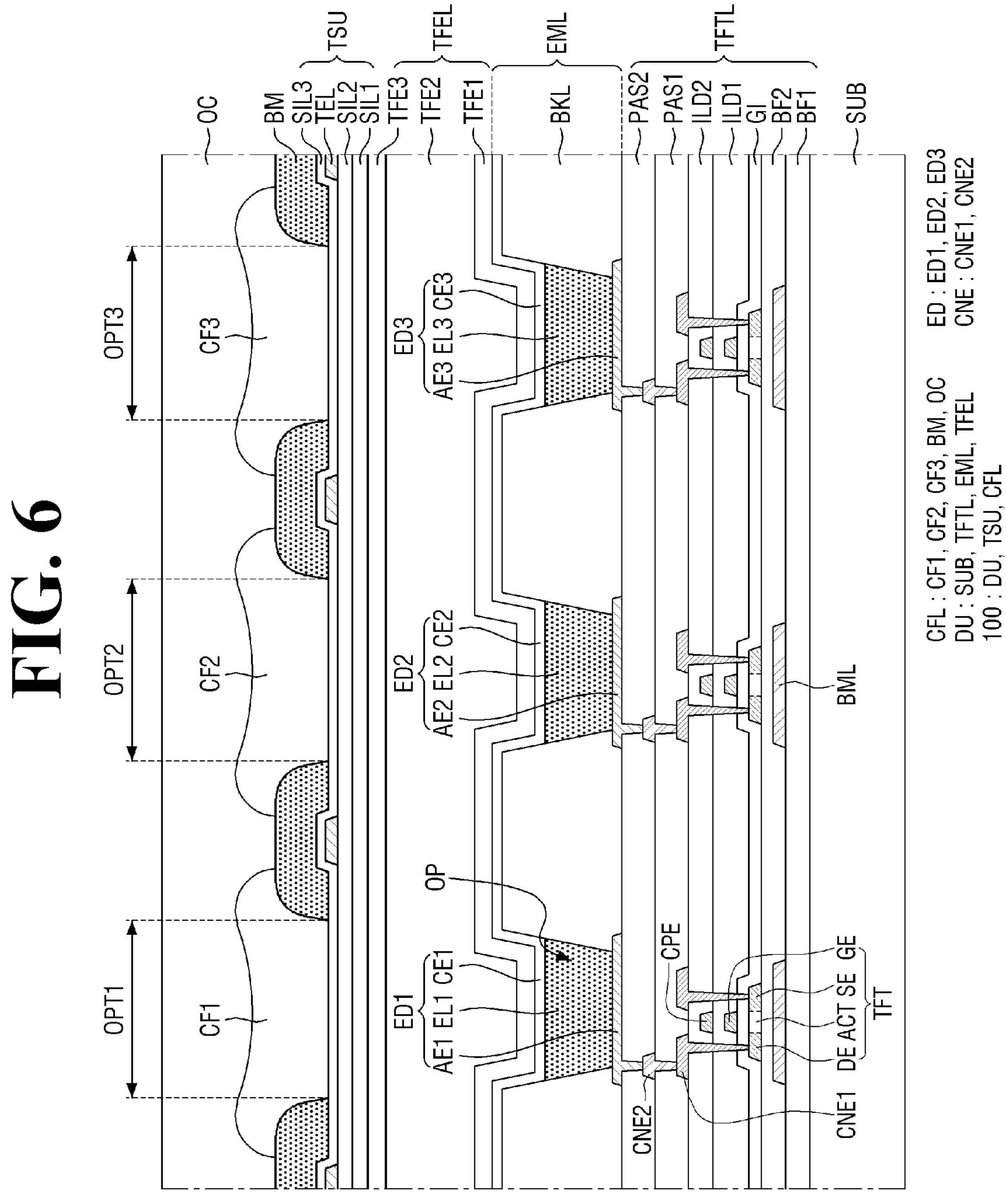
FIG. 6 is an enlarged cross-sectional view illustrating a part of a display device according to one embodiment.

FIG. 6 is an enlarged cross-sectional view illustrating a part of a display device 10 according to one embodiment. The cross-section of FIG. 6 may be a view along a direction parallel to the plane defined by the first direction DR1 and the second direction DR2 crossing each other. For the cross-sectional views variously shown in the Figures, while one direction along the plane is presented, it will be understood that the view direction may be any of a number of directions which is parallel to the planc.

Referring to FIG. 6, the display panel 100 of the display device 10 may include the display layer DU, the touch sensing layer TSU, and the color filter layer CFL.

The display layer DU may include a substrate SUB, a thin film transistor layer TFTL, a light emitting element layer EML, and a thin film encapsulation layer TFEL.

The substrate SUB may be a base substrate or a base member. The substrate SUB may be a flexible substrate which can be bent, folded or rolled. For example, the substrate SUB may include a polymer resin such as polyimide (PI), but is not limited thereto. For another example, the substrate SUB may include a glass material or a metal material.

The thin film transistor layer TFTL may include a first buffer layer BF1, a lower metal layer BML, a second buffer layer BF2, a thin film transistor TFT, a gate insulating layer GI, a first interlayer insulating layer ILD1, a capacitor electrode CPE, a second interlayer insulating layer ILD2, a first connection electrode CNE1, a first passivation layer PAS1, a second connection electrode CNE2, and a second passivation layer PAS2.

The first buffer layer BF1 may be disposed on the substrate SUB. The first buffer layer BF1 may include an inorganic layer capable of preventing penetration of air or moisture. For example, the first buffer layer BF1 may include a plurality of inorganic layers alternately stacked.

The lower metal layer BML as including a lower metal pattern provided in plural spaced apart from each other along the thin film transistor layer TFTL, may be disposed on the first buffer layer BF1. The lower metal layer BML may include a material that blocks light to prevent light from being incident on a semiconductor layer ACT. For example, the lower metal layer BML may be formed as a single layer or multiple layers made of any one of molybdenum (Mo), aluminum (Al), chromium (Cr), gold (Au), titanium (Ti), nickel (Ni), neodymium (Nd) and copper (Cu) and an alloy thereof. In some embodiments, the lower metal layer BML may be omitted.

The second buffer layer BF2 may cover the first buffer layer BF1 and the lower metal layer BML. The second buffer layer BF2 may include an inorganic layer capable of preventing penetration of air or moisture. For example, the second buffer layer BF2 may include a plurality of inorganic layers alternately stacked.

The thin film transistor TFT may be disposed on the second buffer layer BF2, and may constitute a pixel circuit of each of a plurality of pixels PX. For example, the thin film transistor TFT may be a switching transistor or a driving transistor of the pixel circuit. The thin film transistor TFT may include a semiconductor layer ACT, a source electrode SE, a drain electrode DE, and a gate electrode GE. However, the connection electrode CNE as including the first connection electrode CNE1 together with the second connection electrode CNE2 to be described later may also be regarded as a component included in the thin film transistor TFT.

The semiconductor layer ACT may be disposed on the second buffer layer BF2. The semiconductor layer ACT may overlap the lower metal layer BML and the gate electrode GE in the thickness direction, and may be insulated from the gate electrode GE by the gate insulating layer GI. In a part of the semiconductor layer ACT, a material of the semiconductor layer ACT may be made into a conductor to form the source electrode SE and the drain electrode DE.

The gate electrode GE may be disposed on the gate insulating layer GI. For example, the gate electrode GE may be formed of or be a respective pattern of a gate conductive layer (e.g., a first conductive layer). The gate electrode GE may overlap the semiconductor layer ACT with the gate insulating layer GI interposed therebetween.

In the present specification, the conductive layer is a layer containing a conductive material and exhibiting conductivity, and a layer formed of a conductive layer of the same name may be formed by the same process or include the same material. In one embodiment, insulating layers or passivation layers positioned directly above and below the same conductive layer may be identical to each other. However, this may not be the case when the insulating layer or the passivation layer directly positioned above and below the conductive layer is omitted in some regions.

The gate insulating layer GI may be disposed on the semiconductor layer ACT. For example, the gate insulating layer GI may cover the semiconductor layer ACT and the second buffer layer BF2 to insulate the gate electrode GE from the semiconductor layer ACT. The gate insulating layer GI may include (or define) a contact hole through which the first connection electrode CNE1 passes.

The first interlayer insulating layer ILD1 may cover the gate electrode GE and the gate insulating layer GI. For example, the first interlayer insulating layer ILD1 may be formed of (or define) the first insulating layer. The first interlayer insulating layer ILD1 may include a contact hole through which the first connection electrode CNE1 passes. The contact hole of the first interlayer insulating layer ILD1 may be connected to or aligned with the contact hole of the gate insulating layer GI and the contact hole of the second interlayer insulating layer ILD2, such as to form a single contact hole extended through each of the three layers.

The capacitor electrode CPE may be disposed on the first interlayer insulating layer ILD1. For example, the capacitor electrode CPE may be formed of or be a respective pattern of a capacitor conductive layer. The capacitor electrode CPE may overlap the gate electrode GE in the thickness direction. The capacitor electrode CPE and the gate electrode GE may form an electrical capacitance therebetween.

The second interlayer insulating layer ILD2 may cover the capacitor electrode CPE and the first interlayer insulating layer ILD1. The second interlayer insulating layer ILD2 may include a contact hole through which the first connection electrode CNE1 passes. The contact hole of the second interlayer insulating layer ILD2 may be connected to the contact hole of the first interlayer insulating layer ILD1 and the contact hole of the gate insulating layer GI.

The first connection electrode CNE1 may be disposed on the second interlayer insulating layer ILD2. For example, the first connection electrode CNE2 may be formed of or be a respective pattern of a first source/drain conductive layer (e.g., a second conductive layer). The first connection electrode CNE1 may electrically connect the source/drain electrodes SE and DE of the thin film transistor TFT, to the second connection electrode CNE2. The first connection electrode CNE1 may be inserted into or extend through a contact hole provided in the second interlayer insulating layer ILD2 together with the first interlayer insulating layer ILD1, and the gate insulating layer GI to be in contact with the source/drain electrode SE/DE of the thin film transistor TFT. As being in contact, elements may form an interface therebetween, without being limited thereto.

As described above, the first connection electrode CNE1 may also be regarded as an included component of the thin film transistor TFT. In one embodiment, the first connection electrode CNE1 may have the same function as the source/drain electrodes SE and DE of the thin film transistor TFT.

The first passivation layer PAS1 may cover the first connection electrode CNE1 and the second interlayer insulating layer ILD2. For example, the first passivation layer PAS1 may be formed of or define a second insulating layer. The first passivation layer PAS1 may protect the thin film transistor TFT. The first passivation layer PAS1 may include a contact hole through which the second connection electrode CNE2 passes.

The second connection electrode CNE2 may be disposed on the first passivation layer PAS1. For example, the second connection electrode CNE2 may be formed of or be a respective pattern of a second source/drain conductive layer (e.g., a third conductive layer). The second connection electrode CNE2 may electrically connect the first connection electrode CNE1 to respective light emitting elements, such as at the pixel electrodes AE1, AE2, and AE3 of the light emitting element layer ED. The second connection electrode CNE2 may be inserted into (or extend completely through) a contact hole formed in the first passivation layer PAS1 to be in contact with the first connection electrode CNE1. As described above, the second connection electrode CNE2 may also be regarded as an included component of the thin film transistor TFT. In one embodiment, the second connection electrode CNE2 may have the same function as the source/drain electrodes SE and DE of the thin film transistor TFT.

The second passivation layer PAS2 may cover the second connection electrode CNE2 and the first passivation layer PAS1. For example, the second passivation layer PAS2 may be formed of or define a third insulating layer. The second passivation layer PAS2 may include a contact hole through which the pixel electrodes AE1, AE2, and AE3 of the light emitting element layer ED pass.

The light emitting element layer EML may be disposed on the thin film transistor layer TFTL. The light emitting element layer EML may include the light emitting element layer ED and a bank layer BKL. The light emitting element layer ED may include the pixel electrodes AE1, AE2, and AE3, light emitting layers EL1, EL2, and EL3, and common electrodes CE1, CE2, and CE3.

The pixel electrodes AE1, AE2, and AE3 may be disposed on the second passivation layer PAS2. For example, the pixel electrodes AE1, AE2, and AE3 may be formed of or be respective patterns of a first electrode conductive layer (e.g., a fourth conductive layer). The pixel electrodes AE1, AE2, and AE3 may be disposed to overlap one of the openings OP in an opening area defined by the bank layer BKL. The pixel electrodes AE1, AE2, and AE3 may be electrically connected to the drain electrode DE of the thin film transistor TFT through the first and second connection electrodes CNE1 and CNE2.

In one embodiment, the pixel electrodes AE1, AE2, and AE3 may include the first pixel electrode AE1, the second pixel electrode AE2, and the third pixel electrode AE3 disposed in each of the pixels PX. The first pixel electrode AE1, the second pixel electrode AE2, and the third pixel electrode AE3 may be disposed to be spaced apart from each other on the second passivation layer PAS2. In some embodiments, the pixel electrodes AE1, AE2, and AE3 may respectively constitute light emitting elements ED1, ED2, and ED3 emitting light of different colors.

The light emitting layers EL1, EL2, and EL3 may be disposed on the pixel electrodes AE1, AE2, and AE3, respectively.

In one embodiment, the light emitting layers EL1, EL2, and EL3 may be organic light emitting layers made of (or including) organic materials. In the light emitting layers EL1, EL2, and EL3, when the thin film transistor TFT applies a predetermined voltage to the pixel electrodes AE1, AE2, and AE3 of the light emitting elements ED1, ED2, and ED3, and the common electrodes CE1, CE2, and CE3 of the light emitting elements ED1, ED2, and ED3 receive a common voltage or a cathode voltage, holes and electrons may move to the light emitting layers EL1, EL2, and EL3 through a hole transporting layer and an electron transporting layer, respectively, and the holes and the electrons may be combined with each other in the light emitting layers EL1, EL2, and EL3 to emit light.

In an embodiment, the light emitting elements ED1, ED2, and ED3 may include a quantum dot light emitting diode including a quantum dot light emitting layer, an inorganic light emitting diode including an inorganic semiconductor, or a micro light emitting diode.

The light emitting layers EL1. EL2, and EL3 may include a first light emitting layer EL1, a second light emitting layer EL2, and a third light emitting layer EL3. The first light emitting layer EL1 may be disposed on the first pixel electrode AE1, the second light emitting layer EL2 may be disposed on the second pixel electrode AE2, and the third light emitting layer EL3 may be disposed on the third pixel electrode AE3. The first to third light emitting layers EL1, EL2, and EL3 may be the light emitting layers of the first to third light emitting elements ED1, ED2 and ED3, respectively. In some embodiments, the first light emitting layer EL1 may be the light emitting layer emitting red light of the first color, the second light emitting layer EL2 may be the light emitting layer emitting green light of the second color, and the third light emitting layer EL3 may be the light emitting layer emitting blue light of the third color.

The common electrodes CE1, CE2, and CE3 may be disposed on the light emitting layers EL1, EL2, and EL3, respectively. For example, the common electrodes CE1, CE2, and CE3 may be formed of or be respective patterns of a second electrode conductive layer. The common electrodes CE1, CE2, and CE3 may include a transparent conductive material to transmit light generated in the light emitting layers EL1, EL2, and EL3. The common electrodes CE1, CE2, and CE3 may receive a common voltage or a low potential voltage. When the pixel electrodes AE1, AE2, and AE3 receive the voltage corresponding to a data voltage and the common electrodes CE1, CE2, and CE3 receive the low potential voltage, a potential difference is formed between the pixel electrodes AE1, AE2, and AE3 and the common electrodes CE1, CE2, and CE3, so that the light emitting layers EL1, ED2, and ED3 may emit light.

The common electrodes CE1, CE2, and CE3 may include a first common electrode CE1, a second common electrode CE2, and a third common electrode CE3. The first common electrode CE1 may be disposed on the first light emitting layer EL1, the second common electrode CE2 may be disposed on the second light emitting layer EL2, and the third common electrode CE3 may be disposed on the third light emitting layer EL3. As illustrated in the drawing, the common electrodes CE1, CE2, and CE3 may overlap the plurality of pixels PX as an integral electrode, and may be disposed over the entire surface of the display layer DU to extend along the side surface and top surface of solid portions of the bank layer BKL and the top surfaces of the light emitting layers EL1, EL2, and EL3.

The bank layer BKL may be disposed on the thin film transistor layer TFTL or the substrate SUB. The bank layer BKL may include the opening OP disposed in each of the pixels PX. The bank layer BKL may include solid material portions which are spaced apart from each other to define the opening OP therebetween. The opening OP of the bank layer BKL may partition the emission area (e.g., the light emission area) of each of the light emitting elements ED1, ED2, and ED3. For example, the light emitting elements ED1, ED2, and ED3 may overlap the openings OP of the bank layer BKL, respectively.

In some embodiments, the opening OP of the bank layer BKL may overlap the pixel electrodes AE1, AE2, and AE3 and expose portions of the lower pixel electrodes AE1, AE2, and AE3. For example, the solid portions of the bank layer BKL may cover a portion of the pixel electrodes AE1, AE2, and AE3 at both of opposing ends (or edges) of the pixel electrodes AE1, AE2, and AE3 and expose a remaining portion thereof through the opening OP.

In some embodiments, the light emitting layers EL1, EL2, and EL3 of the light emitting elements ED1, ED2, and ED3 may be disposed in the opening OP of the bank layer BKL. However, the present disclosure is not limited thereto, and the light emitting layers EL1, EL2, and EL3 may be conformally disposed on the bank layer BKL to extend along the side surface and the top surface of the solid portions of the bank layer BKL. The side surface of the solid portion of the bank layer BKL may define the opening OP.

In some embodiments, the common electrodes CE1, CE2, and CE3 may be conformally disposed on the bank layer BKL extend along the side surface and the top surface of the bank layer BKL. However, the present disclosure is not limited thereto, and the common electrodes CE1, CE2, and CE3 may be disposed in the opening OP of the bank layer BKL to expose the side surface and/or the top surface of the solid portion of the bank layer BKL to outside the common electrode layer.

The thin film encapsulation layer TFEL may be disposed on the light emitting elements ED1, ED2, and ED3 and the bank layer BKL, and may cover the plurality of light emitting elements ED1, ED2, and ED3 and the bank layer BKL. The thin film encapsulation layer TFEL may include at least one inorganic layer to prevent oxygen or moisture from permeating into the light emitting element layer EML. The thin film encapsulation layer TFEL may include at least one organic layer to protect the light emitting element layer EML from foreign substances such as dust.

In an embodiment, the thin film encapsulation layer TFEL may include a first encapsulation layer TFE1, a second encapsulation layer TFE2, and a third encapsulation layer TFE3 that are sequentially stacked. The first encapsulation layer TFEL and the third encapsulation layer TFE3 may be inorganic encapsulation layers, and the second encapsulation layer TFE2 disposed between the first encapsulation layer TFE1 and the third encapsulation layer TFE3 may be an organic encapsulation layer.

Each of the first encapsulation layer TFE1 and the third encapsulation layer TFE3 may include one or more inorganic insulating materials. The inorganic insulating material may include aluminum oxide, titanium oxide, tantalum oxide, hafnium oxide, zinc oxide, silicon oxide, silicon nitride, and/or silicon oxynitride.

The second encapsulation layer TFE2 may include a polymer-based material. Examples of the polymer-based material may include acrylic resin, epoxy resin, polyimide, polyethylene and the like. For example, the second encapsulation layer TFE2 may include an acrylic resin, for example, polymethyl methacrylate, polyacrylic acid, or the like. The second encapsulation layer TFE2 may be formed by curing a monomer or applying a polymer.

In one embodiment, the first encapsulation layer TFE1 may be disposed on the common electrodes CE1, CE2, and CE3. The first encapsulation layer TFE1 may be conformally disposed along the cross-sectional shape of the common electrodes CE1, CE2, and CE3. The second encapsulation layer TFE2 may be disposed on the first encapsulation layer TFE1. The second encapsulation layer TFE2 may serve to planarize the stepped portion of a lower layer such as the first encapsulation layer TFE1. The third encapsulation layer TFE3 may be disposed on the second encapsulation layer TFE2.

The touch sensing layer TSU may be disposed on the thin film encapsulation layer TFEL. The touch sensing layer TSU may include a first touch insulating layer SIL1, a second touch insulating layer SIL2, a touch electrode TEL, and a third touch insulating layer SIL3.

The first touch insulating layer SIL1 may be disposed on the thin film encapsulation layer TFEL. For example, the first touch insulating layer SIL1 may be formed of or define a fifth insulating layer. The first touch insulating layer SIL1 may have an insulating and optical function. The first touch insulating layer SIL1 may include at least one inorganic layer. Optionally, the first touch insulating layer SIL1 may be omitted.

The second touch insulating layer SIL2 may cover the first touch insulating layer SIL1. For example, the second touch insulating layer SIL2 may be formed of or define a sixth insulating layer.

As in an embodiment to be described later with reference to FIG. 13 and the like, a touch electrode REL as a first touch electrode (see FIG. 13) of another layer may be further disposed on the first touch insulating layer SIL1, and the second touch insulating layer SIL2 may cover the touch electrode REL. The second touch insulating layer SIL2 may have an insulating and optical function. For example, the second touch insulating layer SIL2 may be an inorganic layer containing at least one of a silicon nitride layer, a silicon oxynitride layer, a silicon oxide layer, a titanium oxide layer, and an aluminum oxide layer.

The touch electrode TEL as a second touch electrode may be disposed on the second touch insulating layer SIL2. For example, the touch electrode TEL may be formed of or be a respective pattern of a second touch conductive layer (e.g., a seventh conductive layer). The touch electrode TEL may not overlap the light emitting elements ED1, ED2, and ED3. The touch electrode TEL may be formed of a single layer containing molybdenum (Mo), titanium (Ti), copper (Cu), aluminum (Al), or indium tin oxide (ITO), or may be formed to have a stacked structure (Ti/Al/Ti) of aluminum and titanium, a stacked structure (ITO/AI/ITO) of aluminum and ITO, an Ag—Pd—Cu (APC) alloy, or a stacked structure (ITO/APC/ITO) of APC alloy and ITO.

The third touch insulating layer SIL3 may cover the touch electrode TEL and the second touch insulating layer SIL2. The third touch insulating layer SIL3 may have an insulating and optical function. The third touch insulating layer SIL3 may be made of the material exemplified in association with the second touch insulating layer SIL2.

The color filter layer CFL may include a light blocking layer BM together with the color filters CF1, CF2, and CF3.

The light blocking layer BM may be disposed on the touch sensing layer TSU. The light blocking layer BM may include solid material portions defining a plurality of opening holes OPT1, OPT2, and OPT3 overlapping the openings OP of the bank layer BKL and the light emitting layers EL1, EL2, and EL3. For example, the first opening hole OPT1 may be disposed to overlap the first light emitting layer EL1. The second opening hole OPT2 may be disposed to overlap the second light emitting layer EL2, and the third opening hole OPT3 may be disposed to overlap the third light emitting layer EL3. The planar area or size of each of the opening holes OPT1. OPT2, and OPT3 may be greater than the planar area or size of each of the openings OP of the bank layer BKL. The opening holes OPT1, OPT2, and OPT3 of the light blocking layer BM are formed (or provided) to be larger than the respective openings OP of the bank layer BKL, so that the light emitted from the light emitting layers EL1, EL2, and EL3 may be visually recognized from outside of the electronic device 1 (such as by the user) not only from a position at the front surface but also from a position at the side surface of the display device 10.

The light blocking layer BM may include a light absorbing material. For example, the light blocking layer BM may include an inorganic black pigment or an organic black pigment. The inorganic black pigment may be carbon black, and the organic black pigment may include at least one of lactam black, perylene black, and aniline black, but they are not limited thereto. The light blocking layer BM may prevent visible light infiltration and color mixture between lights emitted from the adjacent pixels PX, which leads to the improvement of color reproducibility of the display device 10.

The color filters CF1, CF2, and CF3 may be disposed on the light blocking layer BM. The color filters CF1, CF2, and CF3 may be disposed to overlap the opening holes OPT1, OPT2, and OPT3 of the light blocking layer BM, respectively. The color filters CF1. CF2, and CF3 may have areas greater than those of the opening holes OPT1, OPT2, and OPT3 of the light blocking layer BM, respectively, and the color filters CF1, CF2, and CF3 may completely cover the light exit area formed by the opening holes OPT1, OPT2, and OPT3 of the light blocking layer BM, respectively.

The color filters CF1, CF2, and CF3 may include a first color filter CF1, a second color filter CF2, and a third color filter CF3. The color filters CF1, CF2, and CF3 may include a colorant such as a dye or a pigment that absorbs light in a wavelength band other than light in a specific wavelength band, and may be disposed to correspond to the color of the light emitted from the light emitting layers EL1. EL2, and EL3. For example, the first color filter CF1 may be a red color filter that is disposed to overlap the first light emitting layer EL1 and transmits only the first light of the red color. The second color filter CF2 may be a green color filter that is disposed to overlap the second light emitting layer EL2 and transmits only the second light of the green color, and the third color filter CF3 may be a blue color filter that is disposed to overlap the third light emitting layer EL3 and transmits only the third light of the blue color.

In the display device 10, the color filters CF1, CF2, and CF3 are disposed to overlap each other, so that the intensity of the reflected light by external light may be reduced. Furthermore, the color of the reflected light by the external light may be controlled by adjusting the disposition, shape, and area of the color filters CF1, CF2, and CF3 in plan view.

The color filter layer CFL may further include an overcoat layer OC.

An overcoat layer OC may be disposed on the color filters CF1, CF2, and CF3 to planarize the top ends of the color filters CF1, CF2, and CF3. The overcoat layer OC may be a colorless light transmissive layer that does not have a color in a visible light band. For example, the overcoat layer OC may include a colorless light transmissive organic material such as an acrylic resin.

Figure 7:
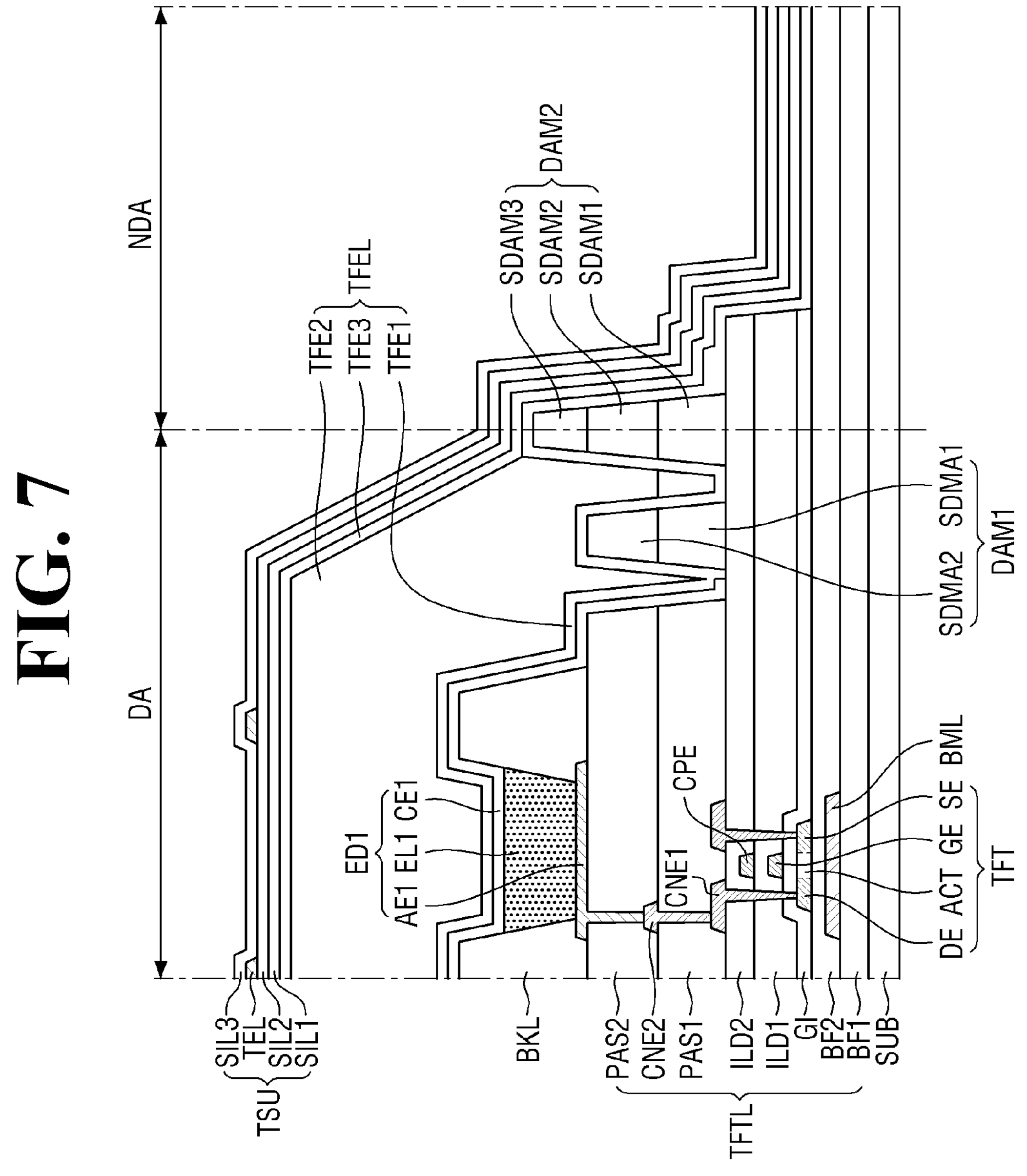
FIG. 7 is an enlarged cross-sectional view illustrating a part of a non-display area of a display device according to one embodiment.

FIG. 7 is a cross-sectional view illustrating a part of a non-display area NDA of a display device 10 according to one embodiment. FIG. 7 is a cross-sectional view illustrating a part of the non-display area NDA on the left or right side of the display area DA with reference to FIG. 4. The view in FIG. 7 may be a structure at a boundary between the display area DA and the non-display area NDA.

Referring to FIG. 7, the display device 10 may include a first dam DAM1 and a second dam DAM2 disposed in the non-display area NDA. The first dam DAM1 and the second dam DAM2 may be disposed at the outermost portion of the display area DA (e.g., closest to the non-display area NDA), and may be disposed to surround the display area DA. The second dam DAM2 may be closer to the non-display area NDA than the first dam DAM1. The first dam DAM1 and the second dam DAM2 may prevent a material for forming the second encapsulation layer TFE2 of the thin film encapsulation layer TFEL from overflowing to the non-display area NDA in a method of providing (or manufacturing) the display device 10.

The first dam DAM1 may include a first sub-dam SDAM1 together with a second sub-dam SDAM2, and the second dam DAM2 may include a first sub-dam SDAM1 together with a second sub-dam SDAM2, and a third sub-dam SDAM3. The first sub-dam SDAM1 and the first passivation layer PAS1 may include the same material, and may be disposed in the same layer as each other. The second sub-dam SDAM2 and the second passivation layer PAS2 may include the same material, and may be disposed on the same layer as each other. The third sub-dam SDAM3 may be disposed on the second sub-dam SDAM2, and may include the same material as that of the second sub-dam SDAM2.

A height or a thickness of elements may be defined from a reference, such as from the substrate SUB or another underlying layer. The height of the first dam DAM1 may be smaller than the height of the second dam DAM2, with respect to a same reference surface. However, the present disclosure is not limited thereto. The height of the first dam DAM1 may be substantially the same as the height of the second dam DAM2 or may be greater than the height of the second dam DAM2.

The first encapsulation layer TFEL and the third encapsulation layer TFE3 may cover the first dam DAM1 and the second dam DAM2 disposed at the outermost portion of the display area DA. The first encapsulation layer TFEL and the third encapsulation layer TFE3 may extend from the display area DA, to the outermost edge of the display panel 100 at the non-display area NDA, by extending over and along the first dam DAM1 and the second dam DAM2.

The second encapsulation layer TFE2 may be disposed to cover the top surface of the first dam DAM1 without covering the top surface of the second dam DAM2. The second encapsulation layer TFE2 may define an end surface which is adjacent to or space apart from the non-display area NDA. However, the present disclosure is not limited thereto. The second encapsulation layer TFE2 may not cover both the top surface of the first dam DAM1 and the top surface of the second dam DAM2. The material for forming second encapsulation layer TFE2 may not overflow to the outer edge of the display panel 100 due to the first dam DAM1 and the second dam DAM2 restricting flow of the material in a direction from the display area DA to the non-display area NDA.

Among the thin film transistor layer TFTL, the gate insulating layer GI, the first interlayer insulating layer ILD1, the second interlayer insulating layer ILD2, the first passivation layer PAS1, and the second passivation layer PAS2, portions thereof may be removed at the outer portion of the second dam DAM2. Portions of the second buffer layer BF2 may be exposed to outside the above layers at the outer portion of the second dam DAM2. Among those layers, only the buffer layers BF1 and BF2 of the thin film transistor layer TFTL may be disposed at the outer side of the second dam DAM2, and a stack of portions of the first encapsulation layer TFE1 together with the third encapsulation layer TFE3 extending to the outermost edge of the display panel 100 may be directly disposed on the exposed portion of the second buffer layer BF2.

In the touch sensing layer TSU, the first touch insulating layer SIL1, the second touch insulating layer SIL2, and the third touch insulating layer SIL3 may extend from the display area DA to the outer portion of non-display area NDA of the second dam DAM2 which is at a side of the second dam DAM2 opposite to the display area DA. However, the present disclosure is not limited thereto, and the first touch insulating layer SIL1, the second touch insulating layer SIL2, and the third touch insulating layer SIL3 may be removed outside the second dam DAM2.

Figure 8:
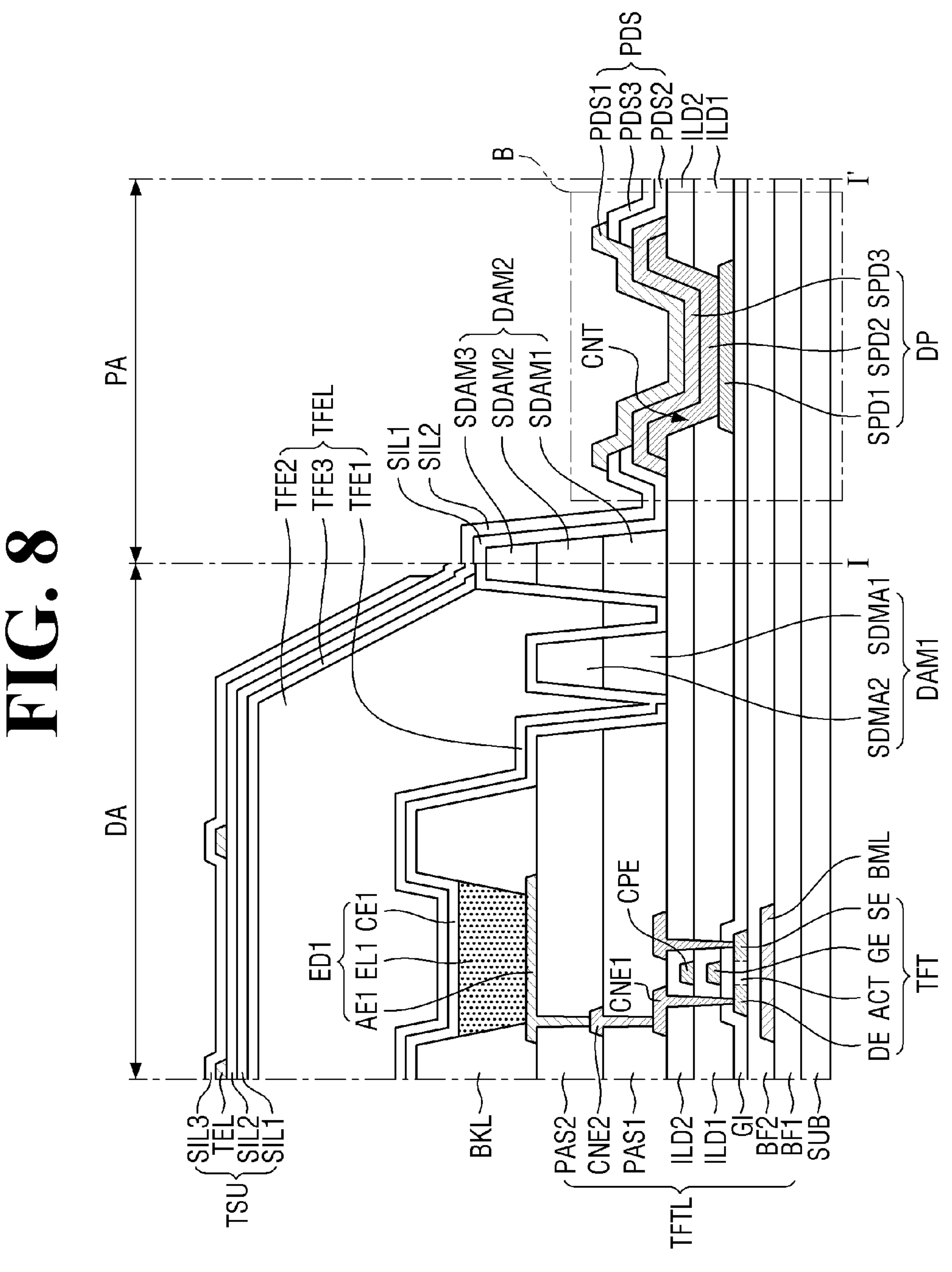
FIG. 8 is an enlarged cross-sectional view illustrating a part of a pad area of a display device according to one embodiment.
Figure 9:
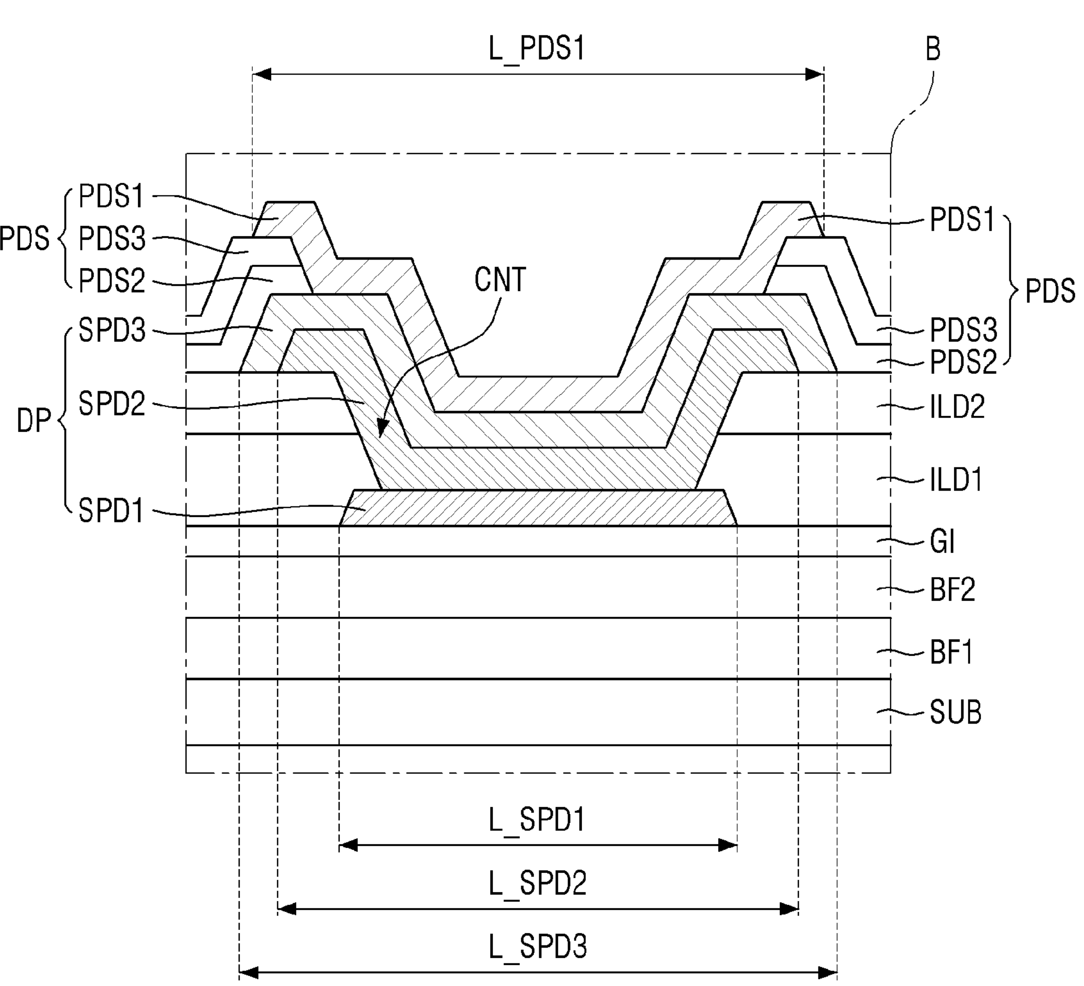
FIG. 9 is an enlarged view of area B of FIG. 8.

FIG. 8 is a cross-sectional view illustrating a part of a pad area PA of a display device 10 according to one embodiment. FIG. 9 is an enlarged view of area B of FIG. 8. FIG. 10 is a cross-sectional view illustrating a pad area PA of a display device 10 and a circuit board 300 disposed thereon according to one embodiment. The view of FIG. 10 may be along the first direction DR1 and/or the second direction DR2, where a plurality of display pad portions DP are arranged along the first direction DR1 or the second direction DR2, respectively.

Referring to FIGS. 8 to 10, the display device 10 may include the display pad portion DP disposed in the pad area PA, and a pad structure PDS disposed thereon. The display pad portion DP and the pad structure PDS may together define a display pad, without being limited thereto.

In one embodiment, unlike the non-display area NDA on the left and right sides of the display area DA described in FIG. 7, the gate insulating layer GI, the first interlayer insulating layer ILD1, and the second interlayer insulating layer ILD2 of the thin film transistor layer TFTL may be disposed in the pad area PA. However, the first passivation layer PAS1 and the second passivation layer PAS2 may not be disposed in the pad area PA, that is, portions of the first passivation layer PAS1 and the second passivation layer PAS2 may be omitted or excluded from the pad area PA.

Since the display pad portion DP and the pad structure PDS are disposed in the pad area PA, the first encapsulation layer TFE1 and the third encapsulation layer TFE3 may be disposed so as not to extend over the second dam DAM2. However, the present disclosure is not limited thereto, and the first encapsulation layer TFE1 and/or the third encapsulation layer TFE3 may extend over or further than the second dam DAM2, and may extend to the pad area PA excluding the planar area in which the display pad portion DP and the pad structure PDS are positioned.

The first touch insulating layer SIL1 and the second touch insulating layer SIL2 of the touch sensing layer TSU may extend from the display area DA to the pad area PA. The first touch insulating layer SIL1 and the second touch insulating layer SIL2 may constitute some layers of the pad structure PDS. The third touch insulating layer SIL3 may be disposed not to extend further than the second dam DAM2, but is not limited thereto, and may extend to the pad area PA excluding the area in which the pad structure PDS is positioned.

The display pad portion DP (e.g., pad electrode) may include a first sub-pad SPD1, a second sub-pad SPD2, and a third sub-pad SPD3. The first to third sub-pads SPD1, SPD2, and SPD3 and portions of the corresponding layers disposed in the display area DA may include the same material and may be formed by the same process, such as to be respective patterns of a same material layer. In the display device 10, the display pad portion DP may be formed by performing one or more process at the display area DA, on the pad area PA, without an additional process.

As shown in FIG. 5, at least one of the first sub-pad SPD1, the second sub-pad SPD2, and the third sub-pad SPD3 may be an extended portion of the fan-out line FL to be electrically connected to the fan-out line FL, and thereby electrically connected to the signal lines disposed on the display area DA (e.g., the gate lines GL, the data lines DL, etc.). The wires or signal lines disposed in the display area DA may be electrically connected to the circuit board 300 through the fan-out line FL together with the display pad portion DP, and the pad structure PDS.

The first sub-pad SPD1 and the gate electrode GE of the thin film transistor layer TFTL may be disposed on the same layer, and may include the same material. The first sub-pad SPD1 may be disposed on the gate insulating layer GI. For example, the first sub-pad SPD1 may be formed of the same gate conductive layer (e.g., the first conductive layer) as the gate electrode GE.

The second sub-pad SPD2 and the first connection electrode CNE1 may be disposed on the same layer, and may include the same material. The second sub-pad SPD2 may be disposed on the first interlayer insulating layer ILD1 and the second interlayer insulating layer ILD2, and may be in direct contact with the first sub-pad SPD1 through a contact hole CNT penetrating the second interlayer insulating layer ILD2 and the first interlayer insulating layer ILD1. For example, the second sub-pad SPD2 may be formed of the same first source/drain conductive layer (e.g., the second conductive layer) as the first connection electrode CNE1.

The second sub-pad SPD2 may be formed as a single layer or multiple layers made of any one of molybdenum (Mo), aluminum (Al), chromium (Cr), gold (Au), titanium (Ti), nickel (Ni), neodymium (Nd) and copper (Cu) and an alloy thereof.

In some embodiments, although not illustrated, the display pad portion DP may further include a sub-pad (not illustrated) as a layer disposed between the first sub-pad SPD1 and the second sub-pad SPD2. A sub-pad (not illustrated) disposed between the first sub-pad SPD1 and the second sub-pad SPD2 may be disposed on the same layer and include the same material as the capacitor electrode CPE. For example, a sub-pad (not illustrated) disposed between the first sub-pad SPD1 and the second sub-pad SPD2 may be formed of the same capacitor conductive layer as the capacitor electrode CPE. A sub-pad (not illustrated) disposed between the first sub-pad SPD1 and the second sub-pad SPD2 may be disposed on the first interlayer insulating layer ILD1, and may be in direct contact with the first sub-pad SPD1 through the contact hole CNT penetrating the first interlayer insulating layer ILD1 in the pad area PA.

The third sub-pad SPD3 and the second connection electrode CNE2 may be disposed on the same layer, and may include the same material. The third sub-pad SPD3 may be disposed on the second interlayer insulating layer ILD2 and the second sub-pad SPD2 and may be in direct contact with the second sub-pad SPD2. For example, the third sub-pad SPD3 may be formed of the same second source/drain conductive layer (e.g., the third conductive layer) as the second connection electrode CNE2. The third sub-pad SPD3 may be made of the material exemplified in association with the second sub-pad SPD2.

The first to third sub-pads SPD1. SPD2, and SPD3 may overlap each other along the third direction DR3 and be electrically connected to each other.

The second sub-pad SPD2 and the third sub-pad SPD3 may be in direct contact with each other, such as to form an interface respectively therebetween. In one embodiment, unlike the first passivation layer PAS1 being interposed between the first connection electrode CNE1 and the second connection electrode CNE2 in the display area DA, the first passivation layer PAS1 may not be interposed between the second sub-pad SPD2 and the third sub-pad SPD3 in the pad area PA.

The third sub-pad SPD3 may completely cover the second sub-pad SPD2. For example, the third sub-pad SPD3 may be in direct contact with the top surface and the side surface of the second sub-pad SPD2 to completely cover the second sub-pad SPD2.

In some embodiments, as described above with reference to FIG. 5, the area of the first sub-pad SPD1 may be smaller than the area of the second sub-pad SPD2 in plan view, and the area of the second sub-pad SPD2 may be smaller than the area of the third sub-pad SPD3 in plan view. For example, referring to FIG. 9, a maximum horizontal length L_SPD1 of the first sub-pad SPD1 may be shorter than a maximum horizontal length L_SPD2 of the second sub-pad SPD2 in cross-sectional view, and the maximum horizontal length L_SPD2 of the second sub-pad SPD2 may be shorter than a maximum horizontal length L_SPD3 of the third sub-pad SPD3 in cross-sectional view.

In the present specification, the maximum horizontal length of the sub-pad SPD may mean the maximum length (or dimension) of the sub-pad SPD among lengths in the first direction DR1 or the second direction DR2, that is, along a direction which is parallel to the plane defined by the first direction DR1 and the second direction DR2 crossing each other. As illustrated in FIG. 9, a respective maximum length may mean the distance between opposing ends of a respective sub-pad which define the outermost edge of the respective sub-pad in cross-sectional view.

According to the display device 10 according to the present embodiment, an organic/inorganic layer such as an insulating layer or a passivation layer is not disposed between the second and third sub-pads SPD2 and SPD3, the second and third sub-pads SPD2 and SPD3 are in direct contact with each other, and the third sub-pad SPD3 is disposed to completely cover the second sub-pad SPD2, so that the second sub-pad SPD2 and the third sub-pad SPD3 may act together like one thick metal layer. Accordingly, electrical characteristics (e.g., conductivity) may be improved compared to a case where an organic/inorganic layer such as an insulating layer or a passivation layer is disposed between the second sub-pad SPD2 and the third sub-pad SPD3.

A first contact area may be defined where the first sub-pad SPD1 and the second sub-pad SPD2 are in direct contact with each other. In an embodiment, the second sub-pad SPD2 and the third sub-pad SPD3 may be in direct contact with each other at a second contact area. FIG. 9 shows the first and second contact areas non-overlapping (e.g., adjacent to or spaced apart from each other.

In some embodiments the second contact area may overlap the first contact area in the third direction DR3. Accordingly, the first to third sub-pads SPD1. SPD2, and SPD3 act together like one thick metal layer, so that electrical characteristics (e.g., conductivity) may be improved compared to a case where the display pad portion DP includes an organic/inorganic layer such as an insulating layer or a passivation layer extended between respective conductive layers.

The pad structure PDS may be disposed on the display pad portion DP. Referring to FIG. 10, the pad structure PDS may be electrically connected to each of the circuit board 300 disposed thereon and to the display pad portion DP disposed thereunder, to thereby connect the circuit board 300 to the display panel 100. For example, the circuit board 300 may be attached to the display panel 100 at the pad area PA by an adhesive member TAP, and the pad structure PDS may be in direct contact with and electrically connected to the bump 550 of the circuit board 300 at an upper surface of the pad structure PDS, and to the third sub-pad SPD3 of the display pad portion DP at a lower surface of the pad structure PDS which is opposite to the upper surface.

The pad structure PDS may include the first pad layer PDS1, a second pad layer PDS2, and a third pad layer PDS3. The first to third pad layers PDS1, PDS2, and PDS3 and the corresponding layers disposed in the display area DA may include the same material and may be formed by the same process. In the display device 10, the pad structure PDS may be formed by performing the process performed in the display area DA for the corresponding layers, also in the pad area PA without an additional process.

The first pad layer PDS1 may be disposed on the third pad layer PDS3. The first pad layer PDS1 may be in direct contact with the display pad portion DP exposed through a hole formed or defined in the second pad layer PDS2 and the third pad layer PDS3. For example, the first pad layer PDS1 may be in direct contact with the third sub-pad SPD3.

The first pad layer PDS1 may include the same material as the touch electrode TEL of the touch sensing layer TSU. For example, the first pad layer PDS1 may be formed of or be a respective pattern of the same second touch conductive layer (e.g., the seventh conductive layer) as the touch electrode TEL. For example, similarly to the touch electrode TEL, the first pad layer PDS1 may be formed of a single layer containing molybdenum (Mo), titanium (Ti), copper (Cu), aluminum (Al), or indium tin oxide (ITO), or may be formed to have a stacked structure (Ti/Al/Ti) of aluminum and titanium, a stacked structure (ITO/AI/ITO) of aluminum and ITO, an Ag—Pd—Cu (APC) alloy, or a stacked structure (ITO/APC/ITO) of APC alloy and ITO. In an embodiment in which the touch electrode TEL has a structure in which Ti/Al/Ti layers are stacked, the pad structure PDS may have a structure in which aluminum (Al) and titanium (Ti) are alternately stacked.

The second pad layer PDS2 may be disposed on the display pad portion DP. For example, the second pad layer PDS2 may be disposed on the second interlayer insulating layer ILD2 and the third sub-pad SPD3. The second pad layer PDS2 may include a hole exposing the third sub-pad SPD3 of the display pad portion DP to outside the second pad layer PDS2. The first pad layer PDS1 may be in direct contact with the display pad portion DP at or through the hole. The second pad layer PDS2 may be disposed on the same layer and include the same material as the first touch insulating layer SIL1 of the touch sensing layer TSU. For example, the second pad layer PDS2 may be formed of or be a respective pattern of the same fifth insulating layer as the first touch insulating layer SIL1.

The third pad layer PDS3 may be disposed on the second pad layer PDS2. The third pad layer PDS3 may include a hole exposing the third sub-pad SPD3 of the display pad portion DP to outside the third pad layer PDS3. The first pad layer PDS1 may be in direct contact with the display pad portion DP through the hole defined by respective holes of the second and third pad layers PDS2 and PDS3. The third pad layer PDS3 may be disposed on the same layer and include the same material as the second touch insulating layer SIL2 of the touch sensing layer TSU. For example, the third pad layer PDS3 may be formed of or be a respective pattern of the same sixth insulating layer as the second touch insulating layer SIL2.

The first pad layer PDS1 may overlap the first to third sub-pads SPD1. SPD2, and SPD3 in the third direction DR3 and may be electrically connected to the stack of sub-pads.

The first pad layer PDS1 may be in direct contact with the third sub-pad SPD3. In one embodiment, unlike the first and second touch insulating layers SIL1 and SIL2 interposed between the second connection electrode CNE2 and the touch electrode TEL in the display area DA, the second and third pad layers PDS2 and PDS3 that are identical to the first and second touch insulating layers SIL1 and SIL2 may not be interposed between the first pad layer PDS1 and the third sub-pad SPD3 in an area overlapping a portion in which the first sub-pad SPD1 and the second sub-pad SPD2 are in direct contact with each other in the pad area PA.

According to the display device 10 according to the present embodiment, the first to third sub-pads SPD1, SPD2, and SPD3 and the first pad layer PDS1 may be respectively in direct contact with each other and act as one metal layer in an area overlapping a portion in which at least the first sub-pad SPD1 and the second sub-pad SPD2 are in direct contact with each other.

In some embodiments, as described above with reference to FIG. 5, the area of the first pad layer PDS1 may be smaller than the area of the third sub-pad SPD3 and may be larger than the area of the second sub-pad SPD2 in plan view. For example, referring to FIG. 9, the maximum horizontal length L_PDS1 of the first pad layer PDS1 in cross-sectional view may be shorter than the maximum horizontal length L_SPD3 of the third sub-pad SPD3, and may be longer than the maximum horizontal length L_SPD2 of the second sub-pad SPD2.

The first pad layer PDS1 may not be in direct contact with a part of the top surface of the third sub-pad SPD3, to define an exposed portion of the third sub-pad SPD3. For example, in the first pad layer PDS1, both of opposing ends of the first pad layer PDS1 may be in direct contact with a portion of the second pad layer PDS2 or the third pad layer PDS3. In an area adjacent to both of the opposing ends of the first pad layer PDS1, the second pad layer PDS2 or the third pad layer PDS3 is disposed between the first pad layer PDS1 and the third sub-pad SPD3, so that the first pad layer PDS1 may be positioned at a lower level from both ends toward the center.

The third sub-pad SPD3 may not be in direct contact with the adhesive member TAP. For example, the third sub-pad SPD3 may be completely covered by the pad structure PDS. For example, the third sub-pad SPD3 may be completely covered by the first to third pad layers PDS1, PDS2, and PDS3. Accordingly, damage applied to the display pad portion DP during bonding may be minimized.

As described above, according to the display device 10 according to the present embodiment, the display pad portion DP and the pad structure PDS disposed on the pad area PA and as respective patterns of the corresponding layers disposed in the display area DA may include the same material and may be formed by the same process. In the display device 10, the display pad portion DP and the pad structure PDS including the same material as the corresponding layers disposed in the display area DA may be formed without a separate additional process, which is advantageous in terms of manufacturing process.

According to the display device 10 according to the present embodiment, in the pad area PA, the display pad portion DP and the pad structure PDS each include layers as respective patterns of metal layers disposed on the display area DA, and the layers at the display pad (e.g., the display pad portion DP together with the pad structure PDS) are disposed to be in direct contact with each other without an organic/inorganic layer such as an insulating layer or a passivation layer interposed therebetween, so that the circuit board 300 may have higher resistance to pressure applied when the circuit board 300 is bonded to the display pad portion DP. Accordingly, the risk of cracking of adjacent members during bonding of the circuit board 300 may be minimized.

According to the display device 10 according to the present embodiment, the display pad portion DP and the pad structure PDS include only metal layers, and the metal layers are disposed to be in direct contact with each other without an organic/inorganic layer such as an insulating layer or a passivation layer interposed therebetween, so that there is an advantage that a conductive adhesive member such as an anisotropic conductive film may be omitted. Accordingly, a short circuit defect between adjacent pad portions may be prevented, and a contact defect between the display pad portion DP and the bump 550 of the circuit board 300 may be prevented.

According to the display device 10 according to the present embodiment, an organic/inorganic layer and the like such as the first passivation layer PAS1, the second passivation layer PAS2, the thin film encapsulation layer TFEL, and the third touch insulating layer SIL3 disposed between the display pad portion DP and the pad structure PDS are removed, so that stepped portions formed in the display pad portion DP and the pad structure PDS along the opening region or hole of the organic/inorganic layer may be minimized. Accordingly, an area in which the pad structure PDS is in contact with the bump 550 disposed thereon may be maximized.

Hereinafter, other embodiments of the display device 10 according to one embodiment will be described. In the following embodiments, description of the same components as those of the above-described embodiment, which are denoted by like reference numerals, will be omitted or simplified, and differences will be mainly described.

Figure 11:
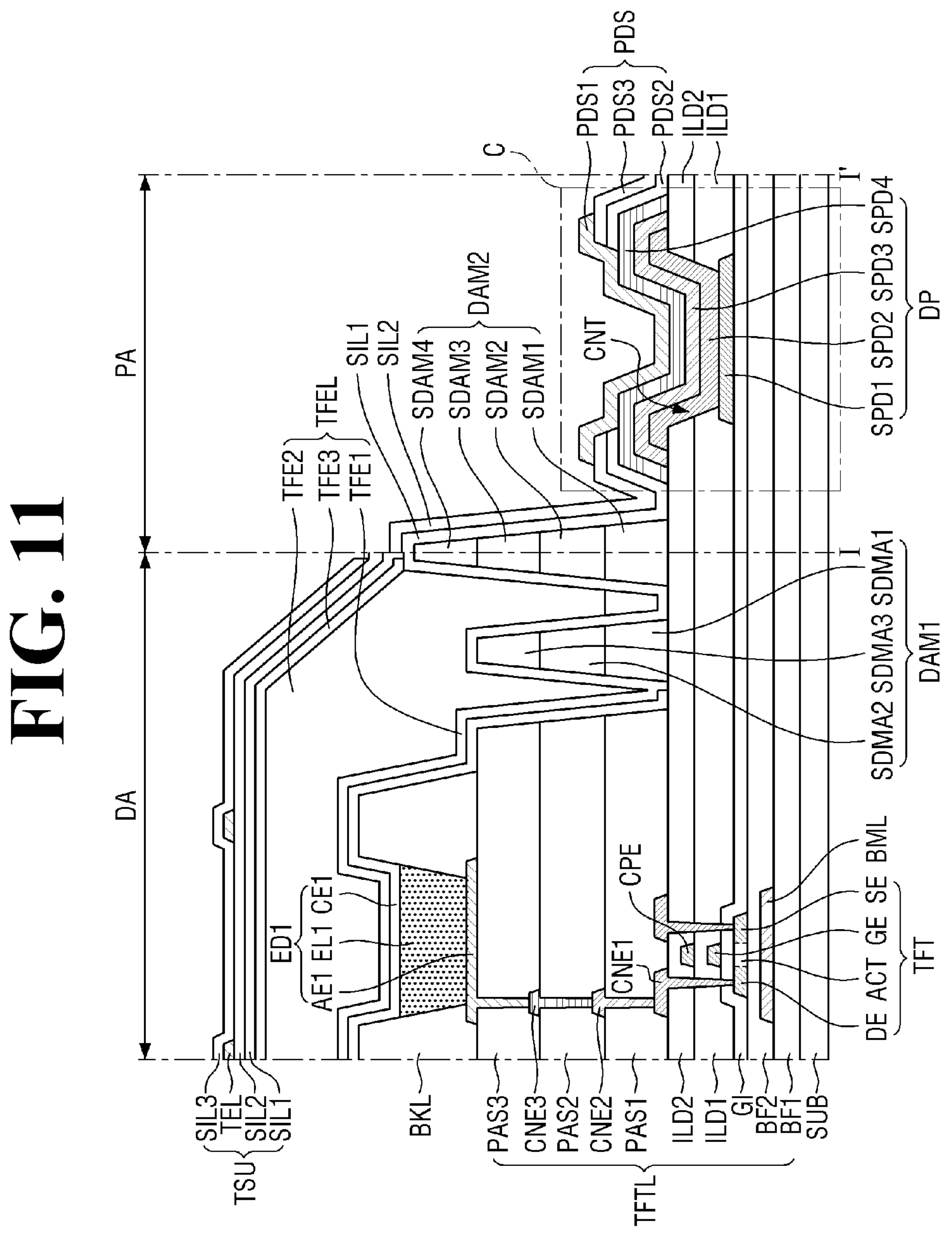
FIG. 11 is an enlarged cross-sectional view illustrating a part of a pad area of a display device according to an embodiment.
Figure 12:
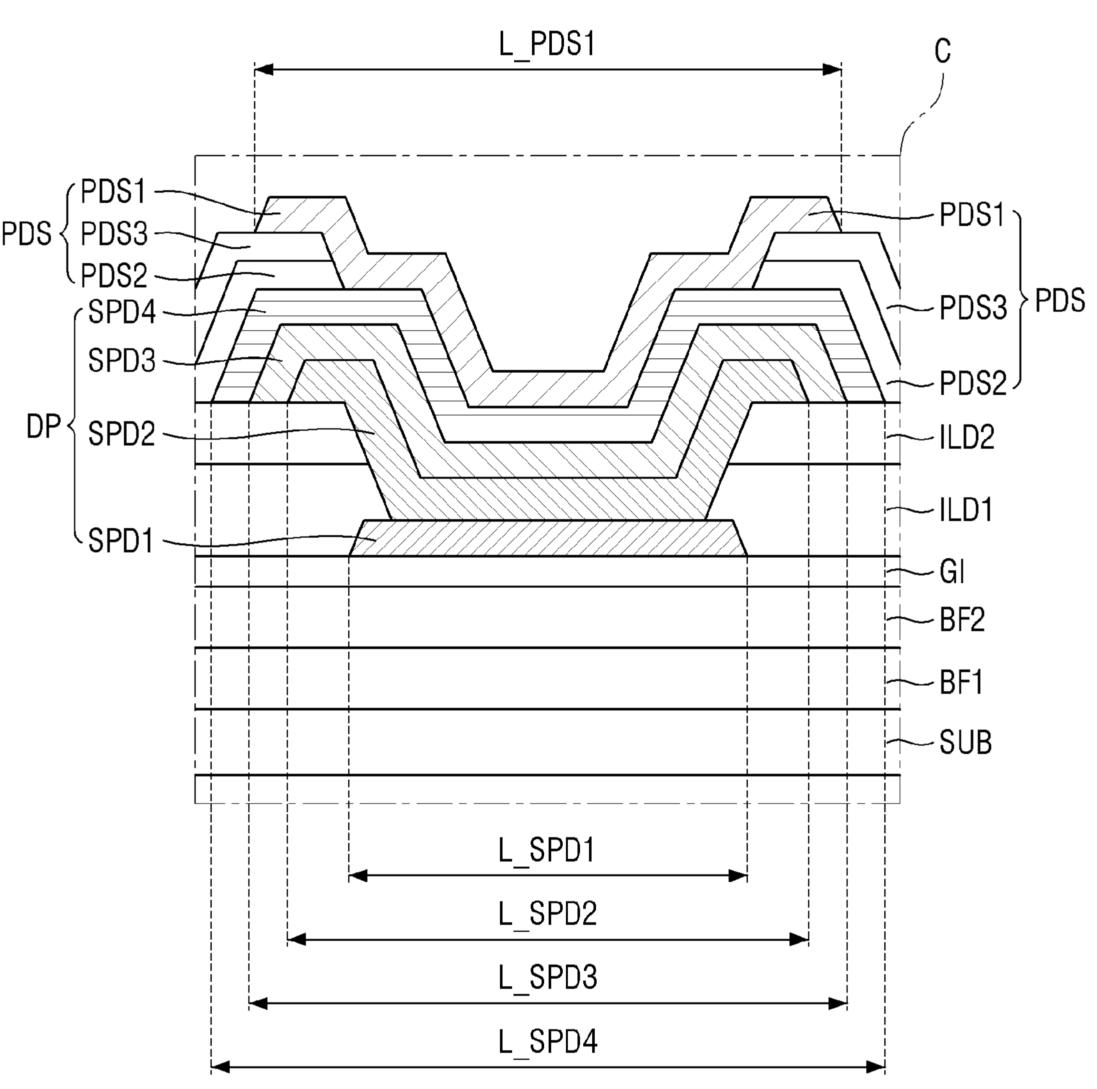
FIG. 12 is an enlarged view of area C of FIG. 11.

FIG. 11 is a cross-sectional view illustrating a part of a pad area PA of a display device 10 according to an embodiment. FIG. 12 is an enlarged view of area C of FIG. 11.

Referring to FIGS. 11 and 12, the display device 10 according to the present embodiment is different from the display device 10 according to one embodiment described with reference to FIG. 8 and the like in that a third connection electrode CNE3 and a fourth sub-pad SPD4 are further included.

More specifically, the display device 10 according to the present embodiment may further include the third connection electrode CNE3, a third passivation layer PAS3, the third sub-dam SDAM3 of the first dam DAM1, a fourth sub-dam SDAM4 of the second dam DAM2, and the fourth sub-pad SPD4.

The thin film transistor layer TFTL may further include the third connection electrode CNE3 disposed on the second connection electrode CNE2 and the third passivation layer PAS3 disposed on the third connection electrode CNE3.

The second connection electrode CNE2 may be disposed on the first passivation layer PAS1. For example, the second connection electrode CNE2 may be formed of or be a respective pattern of a second source/drain conductive layer (e.g., the third conductive layer). The second connection electrode CNE2 may electrically connect the first connection electrode CNE1 to the third connection electrode CNE3. The second connection electrode CNE2 may be inserted into a contact hole formed in the first passivation layer PAS1 to be in contact with the first connection electrode CNE1. As described above, the second connection electrode CNE2 may also be regarded as an included component of the thin film transistor TFT. In one embodiment, the second connection electrode CNE2 may have the same function as the source/drain electrodes SE and DE of the thin film transistor TFT.

The second passivation layer PAS2 may cover the second connection electrode CNE2 and the first passivation layer PAS1. For example, the second passivation layer PAS2 may be formed of or be a portion of a third insulating layer. The second passivation layer PAS2 may include a contact hole through which the third connection electrode CNE3 passes.

The third connection electrode CNE3 may be disposed on the second passivation layer PAS2. For example, the third connection electrode CNE3 may be formed of or be a respective pattern of a third source/drain conductive layer (e.g., a fifth conductive layer). The third connection electrode CNE3 may electrically connect the second connection electrode CNE2 to the pixel electrodes AE1, AE2, and AE3 of the light emitting element layer ED. The third connection electrode CNE3 may be inserted into a contact hole formed in the second passivation layer PAS2 to be in contact with the second connection electrode CNE2. As described above, the third connection electrode CNE3 may also be regarded as an included component of the thin film transistor TFT. In one embodiment, the third connection electrode CNE3 may have the same function as the source/drain electrodes SE and DE of the thin film transistor TFT.

The third passivation layer PAS3 may cover the third connection electrode CNE3 and the second passivation layer PAS2. For example, the third passivation layer PAS3 may be formed of be a portion of a fourth insulating layer. The third passivation layer PAS3 may include a contact hole through which the pixel electrodes AE1, AE2, and AE3 of the light emitting element layer ED pass.

The first dam DAM1 may include a first sub-dam SDAM1, a second sub-dam SDAM2, and a third sub-dam SDAM3, and the second dam DAM2 may include a first sub-dam SDAM1, a second sub-dam SDAM2, a third sub-dam SDAM3, and a fourth sub-dam SDAM4. The first sub-dam SDAM1 and the first passivation layer PAS1 may include the same material, and may be disposed on the same layer. The second sub-dam SDAM2 and the second passivation layer PAS2 may include the same material, and may be disposed on the same layer. The third sub-dam SDAM3 and the third passivation layer PAS3 may include the same material, and may be disposed on the same layer. The fourth sub-dam SDAM4 may be disposed on the third sub-dam SDAM3, and may include the same material as that of the third sub-dam SDAM3.

The display pad portion DP may further include the fourth sub-pad SPD4 disposed on the third sub-pad SPD3. The fourth sub-pad SPD4 and the corresponding layer disposed in the display area DA may include the same material and may be formed by the same process. In the display device 10, the display pad portion DP may be formed by performing the process performed in the display area DA also in the pad area PA without an additional process.

At least one of the first to fourth sub-pads SPD1, SPD2, SPD3, and SPD4 may be electrically connected to the fan-out line FL to be electrically connected to lines disposed in the display area DA. The wires disposed in the display area DA may be electrically connected to the circuit board 300 through the fan-out line FL, the display pad portion DP, and the pad structure PDS.

The fourth sub-pad SPD4 and the third connection electrode CNE3 may be disposed on the same layer, and may include the same material. The fourth sub-pad SPD4 may be disposed on the second interlayer insulating layer ILD2 and the third sub-pad SPD3 and may be in direct contact with the third sub-pad SPD3. For example, the fourth sub-pad SPD4 may be formed of or be a respective pattern of the same fifth conductive layer as the third connection electrode CNE3. The fourth sub-pad SPD4 may be formed of the material exemplified in association with the second sub-pad SPD2.

The first to fourth sub-pads SPD1. SPD2, SPD3, and SPD4 may overlap each other along the third direction DR3 and be electrically connected to each other.

The second to fourth sub-pads SPD2, SPD3, and SPD4 may be in direct contact with each other. In one embodiment, unlike the first passivation layer PAS1 and the second passivation layer PAS2 being interposed among the first connection electrode CNE1, the second connection electrode CNE2, and the third connection electrode CNE3 in the display area DA, the first passivation layer PAS1 and the second passivation layer PAS2 may not be interposed among the second to fourth sub-pads SPD2, SPD3, and SPD4 in the pad area PA.

The fourth sub-pad SPD4 may completely cover the third sub-pad SPD3. For example, the fourth sub-pad SPD4 may be in direct contact with the top surface and the side surface of the third sub-pad SPD3 to completely cover the third sub-pad SPD3.

In some embodiments, the area of the fourth sub-pad SPD4 may be greater than the area of the third sub-pad SPD3 in plan view. For example, referring to FIG. 12, a maximum horizontal length L_SPD4 of the fourth sub-pad SPD4 may be longer than the maximum horizontal length L_SPD3 of the third sub-pad SPD3 in cross-sectional view.

According to the display device 10 according to the present embodiment, an organic/inorganic layer such as an insulating layer or a passivation layer is not disposed among the second to fourth sub-pads SPD2, SPD3, and SPD4, the second to fourth sub-pads SPD2, SPD3, and SPD4 are in direct contact with each other, and the fourth sub-pad SPD4 is disposed to completely cover the third sub-pad SPD3, so that the second to fourth sub-pads SPD2, SPD3, and SPD4 may act like one thick metal layer. Accordingly, electrical characteristics (e.g., conductivity) may be improved compared to a case where an organic/inorganic layer such as an insulating layer or a passivation layer is disposed respectively between the second to fourth sub-pads SPD2, SPD3, and SPD4.

In some embodiments, the third sub-pad SPD3 and the fourth sub-pad SPD4 may be in direct contact with each other in an area overlapping a portion in which the first sub-pad SPD1 and the second sub-pad SPD2 are in direct contact with each other in the third direction DR3. Accordingly, the first to fourth sub-pads SPD1. SPD2, SPD3, and SPD4 act like one thick metal layer, so that electrical characteristics (e.g., conductivity) may be improved compared to a case where the display pad portion DP includes an organic/inorganic layer such as an insulating layer or a passivation layer.

The pad structure PDS may be disposed on the display pad portion DP to define a display pad of the display panel 100. The pad structure PDS may be electrically connected to each of the circuit board 300 disposed thereon and the display pad portion DP disposed thereunder. For example, the circuit board 300 may be attached on the pad area PA of the display panel 100 by an adhesive member TAP, and the pad structure PDS may be in direct contact with and electrically connected to the bump 550 of the circuit board 300, and the fourth sub-pad SPD4 of the display pad portion DP.

The first pad layer PDS1 may be in direct contact with the fourth sub-pad SPD4, and the second pad layer PDS2 may be disposed on the second interlayer insulating layer ILD2 and the fourth sub-pad SPD4 and be in direct contact with the second interlayer insulating layer ILD2 and the fourth sub-pad SPD4. The second pad layer PDS2 and the third pad layer PDS3 may include holes exposing the fourth sub-pad SPD4 of the display pad portion DP. The first pad layer PDS1 may be in direct contact with the display pad portion DP through the hole.

According to the display device 10 according to the present embodiment, when the first passivation layer PAS1 and the second passivation layer PAS2 are not disposed in the pad area PA, the pad area PA may be positioned at a lower level than the display area DA. A height difference between the display area DA and the pad area PA may be supplemented by additionally disposing the fourth sub-pad SPD4 disposed in the pad area PA. Accordingly, the display pad portion DP and the bump 550 of the circuit board 300 may be directly connected without an additional spacer or an anisotropic conductive film.

Figure 13:
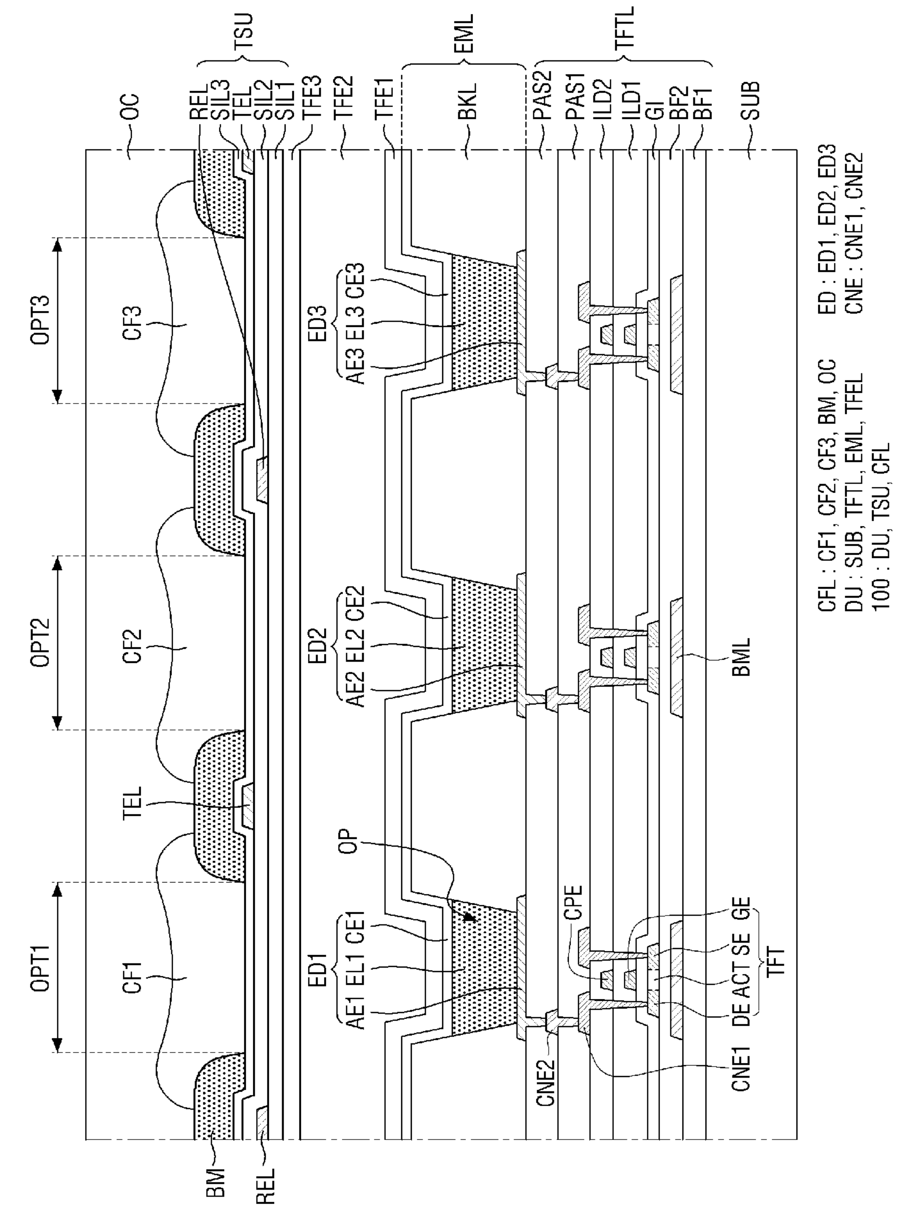
FIG. 13 is an enlarged cross-sectional view illustrating a part of a display device according to an embodiment.
Figure 14:
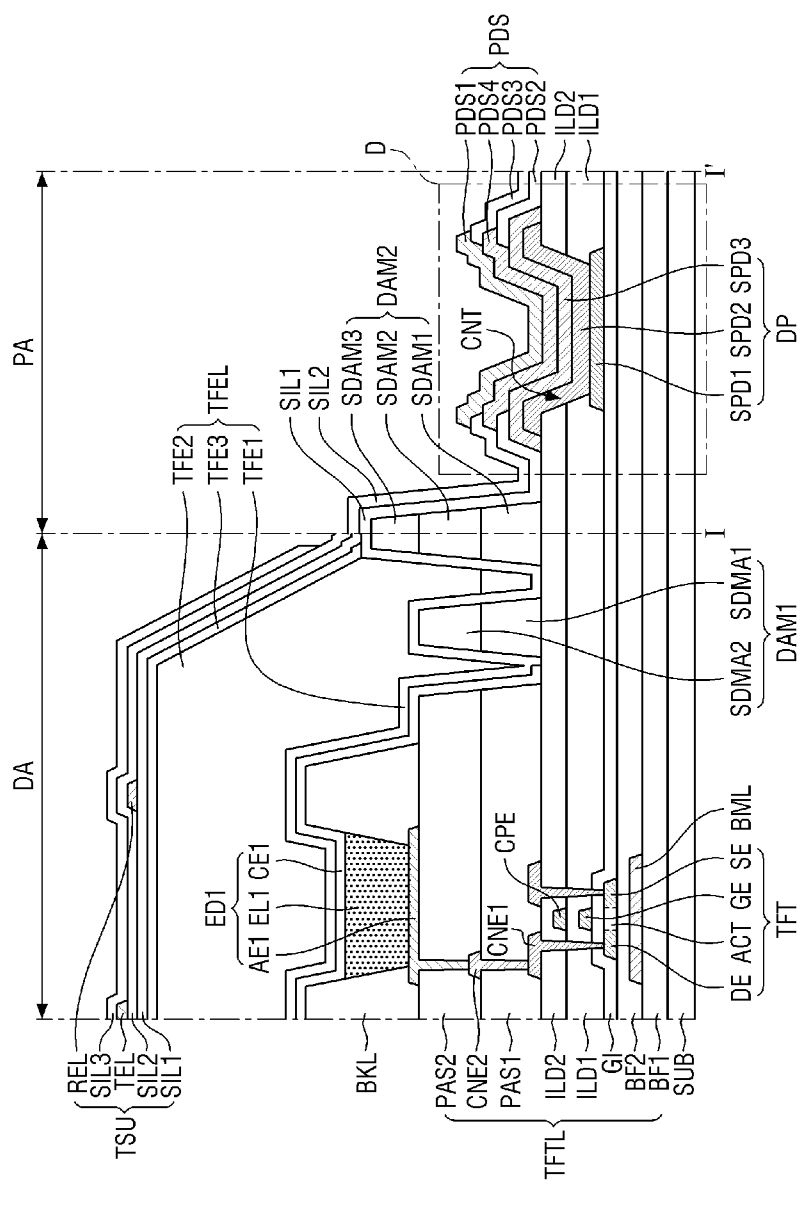
FIG. 14 is an enlarged cross-sectional view illustrating a part of a pad area of a display device according to an embodiment.
Figure 15:
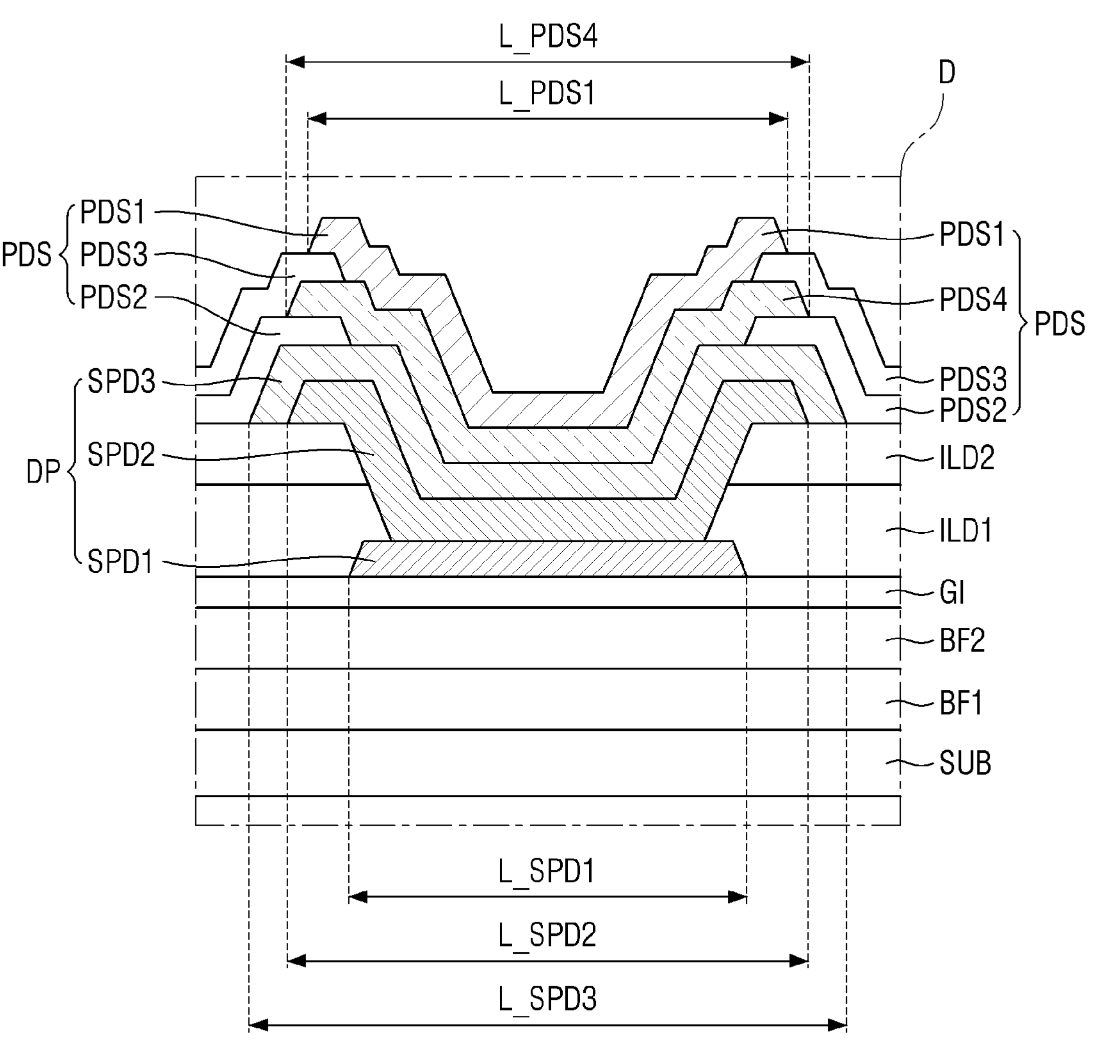
FIG. 15 is an enlarged view of area D of FIG. 14.

FIG. 13 is a cross-sectional view illustrating a part of a display device 10 according to an embodiment. FIG. 14 is a cross-sectional view illustrating a part of a pad area PA of a display device 10 according to an embodiment. FIG. 15 is an enlarged view of part D of FIG. 14.

Referring to FIGS. 13 to 15, the display device 10 according to the present embodiment is different from the display device 10 according to one embodiment described with reference to FIG. 6 and the like in that a first touch electrode REL and a fourth pad layer PDS4 are further included.

More specifically, the display device 10 according to the present embodiment may further include the first touch electrode REL of the touch sensing layer TSU and the fourth pad layer PDS4 of the pad structure PDS.

The touch sensing layer TSU may include a first touch insulating layer SIL1, a first touch electrode REL, a second touch insulating layer SIL2, a second touch electrode TEL, and a third touch insulating layer SIL3, in order from the thin film encapsulation layer TFEL, in a direction away from the substrate SUB.

Since the first touch insulating layer SIL1, the second touch electrode TEL, and the third touch insulating layer SIL3 have the same configuration as the display device 10 according to one embodiment described with reference to FIG. 6 and the like, a detailed description will be omitted.

The first touch electrode REL may be disposed on the first touch insulating layer SIL1. For example, the first touch electrode REL may be formed of or be a respective pattern of a first touch conductive layer (e.g., a sixth conductive layer). The first touch electrode REL may not overlap the light emitting elements ED1, ED2, and ED3. The first touch electrode REL may be formed of a single layer containing molybdenum (Mo), titanium (Ti), copper (Cu), aluminum (Al), or indium tin oxide (ITO), or may be formed to have a stacked structure (Ti/Al/Ti) of aluminum and titanium, a stacked structure (ITO/Al/ITO) of aluminum and ITO, an Ag—Pd—Cu (APC) alloy, or a stacked structure (ITO/APC/ITO) of APC alloy and ITO.

The second touch insulating layer SIL2 may cover the first touch insulating layer SIL1 and the first touch electrode REL.

The second touch electrode TEL may be disposed on the second touch insulating layer SIL2. For example, the second touch electrode TEL may be formed of or be a respective pattern of a second touch conductive layer (e.g., the seventh conductive layer). The second touch electrode TEL may not overlap the light emitting elements ED1, ED2, and ED3. The second touch electrode TEL may be formed of a single layer containing molybdenum (Mo), titanium (Ti), copper (Cu), aluminum (Al), or indium tin oxide (ITO), or may be formed to have a stacked structure (Ti/Al/Ti) of aluminum and titanium, a stacked structure (ITO/Al/ITO) of aluminum and ITO, an Ag—Pd—Cu (APC) alloy, or a stacked structure (ITO/APC/ITO) of APC alloy and ITO.

The pad structure PDS may include the first pad layer PDS1, the second pad layer PDS2, the third pad layer PDS3, and the fourth pad layer PDS4. The first to fourth pad layers PDS1, PDS2, PDS3, and PDS4 and the corresponding layers disposed in the display area DA may include the same material and may be formed by the same process. In the display device 10, the pad structure PDS may be formed by performing the process performed in the display area DA also in the pad area PA without an additional process.

The first pad layer PDS1 may be disposed on the third pad layer PDS3 and the fourth pad layer PDS4. The first pad layer PDS1 may be in direct contact with the fourth pad layer PDS4 exposed through a hole formed in the third pad layer PDS3.

The first pad layer PDS1 may include the same material as the second touch electrode TEL of the touch sensing layer TSU. For example, the first pad layer PDS1 may be formed of or be a respective pattern of the same second touch conductive layer (e.g., the seventh conductive layer) as the second touch electrode TEL. For example, similarly to the second touch electrode TEL, the first pad layer PDS1 may be formed of a single layer containing molybdenum (Mo), titanium (Ti), copper (Cu), aluminum (Al), or indium tin oxide (ITO), or may be formed to have a stacked structure (Ti/Al/Ti) of aluminum and titanium, a stacked structure (ITO/Al/ITO) of aluminum and ITO, an Ag—Pd—Cu (APC) alloy, or a stacked structure (ITO/APC/ITO) of APC alloy and ITO. In an embodiment in which the second touch electrode TEL has a structure in which Ti/Al/Ti layers are stacked, the pad structure PDS may have a structure in which aluminum (Al) and titanium (Ti) are alternately stacked.

The fourth pad layer PDS4 may be disposed on the second pad layer PDS2. The fourth pad layer PDS4 may be in direct contact with the display pad portion DP exposed through a hole formed in the second pad layer PDS2. For example, the fourth pad layer PDS4 may be in direct contact with the third sub-pad SPD3.

The fourth pad layer PDS4 may include the same material as the first touch electrode REL of the touch sensing layer TSU. For example, the fourth pad layer PDS4 may be formed of or be a respective pattern of the same first touch conductive layer (e.g., the sixth conductive layer) as the first touch electrode REL. For example, similarly to the first touch electrode REL, the fourth pad layer PDS4 may be formed of a single layer containing molybdenum (Mo), titanium (Ti), copper (Cu), aluminum (Al), or indium tin oxide (ITO), or may be formed to have a stacked structure (Ti/Al/Ti) of aluminum and titanium, a stacked structure (ITO/Al/ITO) of aluminum and ITO, an Ag—Pd—Cu (APC) alloy, or a stacked structure (ITO/APC/ITO) of APC alloy and ITO. In an embodiment in which the first touch electrode REL has a structure in which Ti/Al/Ti layers are stacked, the pad structure PDS may have a structure in which aluminum (Al) and titanium (Ti) are alternately stacked.

The second pad layer PDS2 may be disposed on the display pad portion DP. For example, the second pad layer PDS2 may be disposed on the second interlayer insulating layer ILD2 and the third sub-pad SPD3. The second pad layer PDS2 may include a hole exposing the third sub-pad SPD3 of the display pad portion DP. The fourth pad layer PDS4 may be in direct contact with the third sub-pad SPD3 through the hole. The second pad layer PDS2 may be disposed on the same layer as the first touch insulating layer SIL1 of the touch sensing layer TSU and may include the same material. For example, the second pad layer PDS2 may be formed of or be a respective pattern of the same fifth insulating layer as the first touch insulating layer SIL1.

The third pad layer PDS3 may be disposed on the second pad layer PDS2 and the fourth pad layer PDS4. The third pad layer PDS3 may include a hole exposing the fourth pad layer PDS4. The first pad layer PDS1 may be in direct contact with the fourth pad layer PDS4 through the hole. The third pad layer PDS3 may be disposed on the same layer as the second touch insulating layer SIL2 of the touch sensing layer TSU and may include the same material. For example, the third pad layer PDS3 may be formed of the same sixth insulating layer as the second touch insulating layer SIL2.

The fourth pad layer PDS4 may overlap the first to third sub-pads SPD1. SPD2, and SPD3 and the first pad layer PDS1 in the third direction DR3 and may be electrically connected to each other.

The fourth pad layer PDS4 may be in direct contact with the third sub-pad SPD3. In one embodiment, unlike the first and second touch insulating layers SIL1 and SIL2 interposed between the second connection electrode CNE2 and the touch electrode TEL in the display area DA, the second and third pad layers PDS2 and PDS3 that are identical to the first and second touch insulating layers SIL1 and SIL2 may not be interposed between the first pad layer PDS1 and the third sub-pad SPD3 in an area overlapping a portion in which the first sub-pad SPD1 and the second sub-pad SPD2 are in direct contact with each other in the pad area PA. For example, a third contact area is defined where the fourth pad layer PDS4 is in direct contact with the first pad layer PDS1 without the sixth insulating layer therebetween, and the third contact area overlaps the first contact area where the first sub-pad SPD1 and the second sub-pad SPD2 are in direct contact with each other.

According to the display device 10 according to the present embodiment, the first to third sub-pads SPD1, SPD2, and SPD3, the first pad layer PDS1, and the fourth pad layer PDS4 may be in direct contact with each other and act as one metal layer in an area overlapping a portion in which at least the first sub-pad SPD1 and the second sub-pad SPD2 are in direct contact with each other.

In some embodiments, the area of the fourth pad layer PDS4 may be smaller than the area of the third sub-pad SPD3 and may be larger than the area of the first pad layer PDS1 and the second sub-pad SPD2 in plan view. For example, referring to FIG. 15 in cross-sectional view, the maximum horizontal length L_PDS4 of the fourth pad layer PDS4 may be shorter than the maximum horizontal length L_SPD3 of the third sub-pad SPD3, and may be longer than the maximum horizontal length L_PDS1 of the first pad layer PDS1 and the maximum horizontal length L_SPD2 of the second sub-pad SPD2.

The fourth pad layer PDS4 may not be in direct contact with a part of the top surface of the third sub-pad SPD3. For example, in the fourth pad layer PDS4, both ends of the fourth pad layer PDS4 may be in direct contact with the second pad layer PDS2 or the third pad layer PDS3. In an area adjacent to both ends of the fourth pad layer PDS4, the second pad layer PDS2 or the third pad layer PDS3 is disposed between the fourth pad layer PDS4 and the third sub-pad SPD3, so that the fourth pad layer PDS4 may be positioned at a lower level from both ends toward the center.

Figure 16:
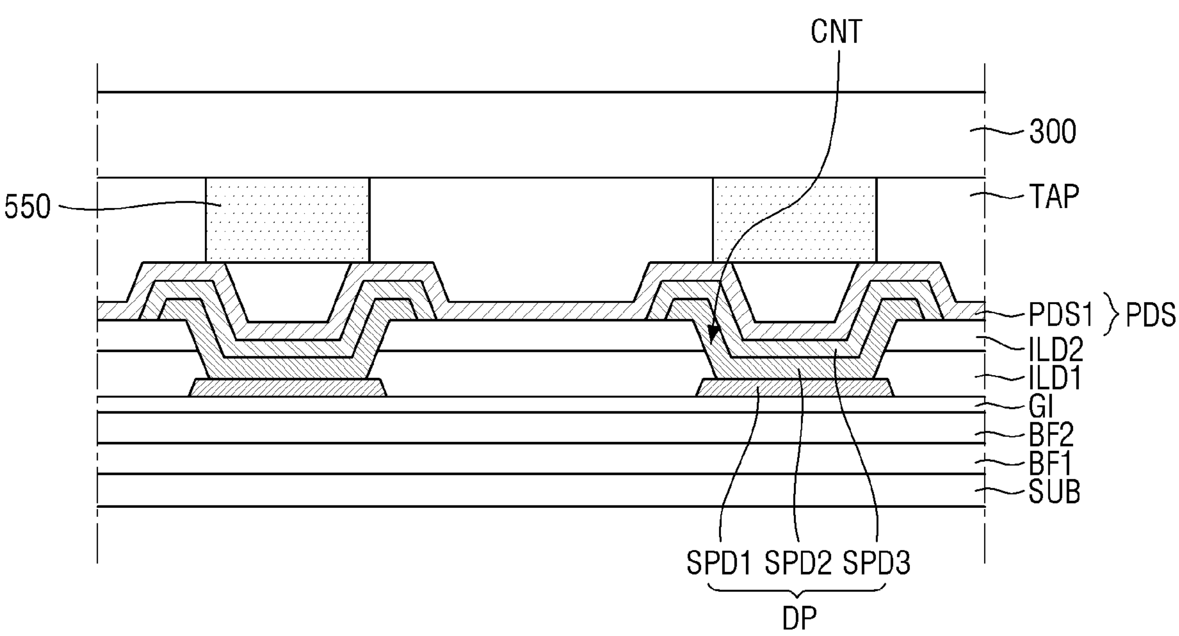
FIG. 16 is an enlarged cross-sectional view illustrating a pad area of a display device and a circuit board disposed thereon according to an embodiment.

FIG. 16 is a cross-sectional view illustrating a pad area PA of a display device 10 and a circuit board 300 disposed thereon according to an embodiment.

Referring to FIG. 16, the display device 10 according to the present embodiment is different from the display device 10 according to one embodiment described with reference to FIG. 10 and the like in that the pad structure PDS does not include the second pad layer PDS2 and the third pad layer PDS3.

More specifically, the pad structure PDS of the display device 10 according to the present embodiment may include the first pad layer PDS1, and may not include (e.g., may exclude) the second pad layer PDS2 and the third pad layer PDS3.

Since the pad structure PDS of the display device 10 according to the present embodiment does not include the second pad layer PDS2 and the third pad layer PDS3, the first pad layer PDS1 may be directly disposed on the display pad portion DP. For example, the first pad layer PDS1 may be directly disposed on the third sub-pad SPD3 and the second interlayer insulating layer ILD2. The first pad layer PDS1 may completely cover the third sub-pad SPD3. For example, the first pad layer PDS1 may be in direct contact with and completely cover both the top surface and the side surface of the third sub-pad SPD3.

According to the display device 10 according to the present embodiment, the first pad layer PDS1 is in direct contact with the display pad portion DP without the second pad layer PDS2 and the third pad layer PDS3, so that the number of stepped portions formed in the first pad layer PDS1 may be reduced. Accordingly, the area of the flat surface of the top surface of the first pad layer PDS1 may increase, so that the area that may be in contact with the bump 550 may increase.

Figure 17:
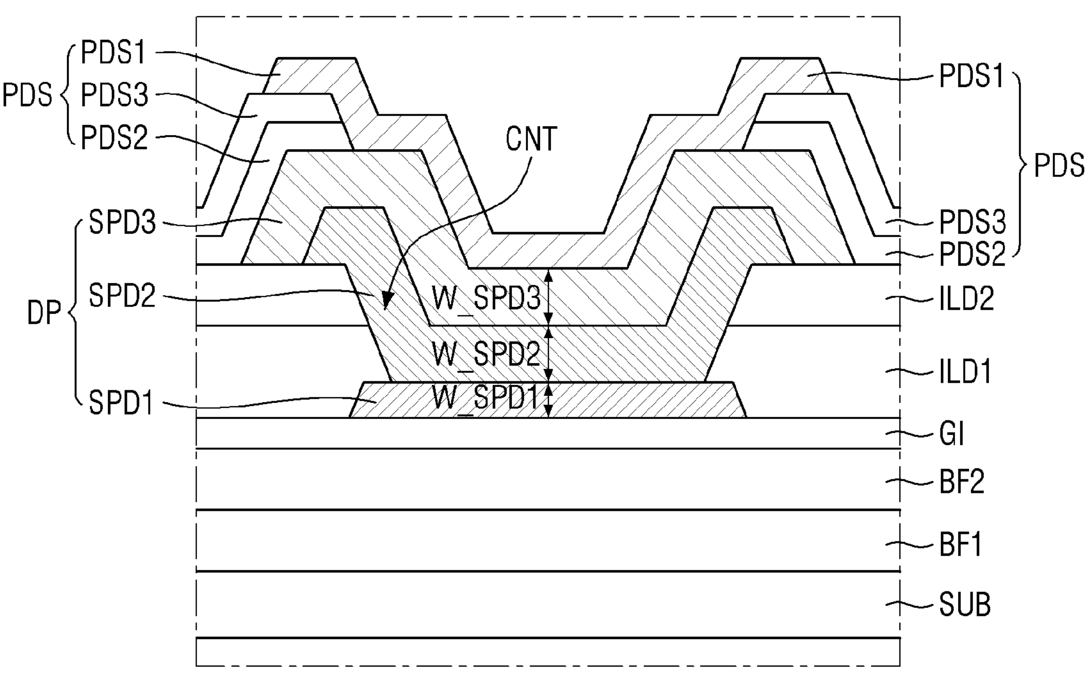
FIG. 17 is an enlarged cross-sectional view of a display pad portion according to an embodiment.

FIG. 17 is an enlarged view of a display pad portion DP according to an embodiment.

Referring to FIG. 17, the display device 10 according to the present embodiment is different from the display device 10 according to one embodiment described with reference to FIG. 9 and the like in that thicknesses of the second sub-pad SPD2 and the third sub-pad SPD3 are greater than the thickness of the first sub-pad SPD1.

More specifically, thicknesses W_SPD2 and W_SPD3 of the second sub-pad SPD2 and the third sub-pad SPD3 may be greater than a thickness W_SPD1 of the first sub-pad SPD1. For example, the thicknesses W_SPD2 and W_SPD3 of the second sub-pad SPD2 and the third sub-pad SPD3 may be two to ten times the thickness W_SPD1 of the first sub-pad SPD1.

In the present specification, the thicknesses W_SPD1, W_SPD2, and W_SPD3 of the first to third sub-pads SPD1, SPD2, and SPD3 may mean the largest distance among the shortest distances from a point on the bottom surface of each component to a point on the top surface.

In one embodiment, the thicknesses W_SPD2 and W_SPD3 of the second sub-pad SPD2 and the third sub-pad SPD3 may be identical to each other, but are not limited thereto, and either one may have a greater thickness.

According to the display device 10 according to the present embodiment, when the first passivation layer PAS1 and the second passivation layer PAS2 are not disposed in the pad area PA, the pad area PA may be positioned at a lower level than the display area DA. In order to directly connect the display pad portion DP to the bump 550 of the circuit board 300, the thicknesses of the second sub-pad SPD2 and the third sub-pad SPD3 disposed in the pad area PA are adjusted, so that a height difference between the display area DA and the pad area PA may be compensated.

In some embodiments, like the embodiment described with reference to FIG. 11 and the like, when the display device 10 further includes the fourth sub-pad SPD4, it is obvious that the thickness of the fourth sub-pad SPD4 may be changed similarly to the thicknesses of the second and third sub-pads SPD2 and SPD3.

In concluding the detailed description, those skilled in the art will appreciate that many variations and modifications can be made to the embodiments without substantially departing from the principles of the invention. Therefore, the disclosed embodiments of the invention are used in a generic and descriptive sense only and not for purposes of limitation.

What is claimed is:

1. A display device comprising:

a substrate comprising a display area, and a pad area which is adjacent to the display area and comprises a pad electrode;

the display area comprising:

a thin film transistor including a gate electrode and a drain electrode, and a pixel electrode which is connected to the thin film transistor;

the pad electrode of the pad area including a first sub-pad, a second sub-pad and a third sub-pad which overlap each other and are electrically connected to each other; and in order from the substrate:

a first conductive layer including the first sub-pad of the pad electrode;

a first insulating layer;

a second conductive layer including the second sub-pad of the pad electrode;

a second insulating layer;

a third conductive layer including the third sub-pad of the pad electrode;

a third insulating layer; and a fourth conductive layer including the pixel electrode, wherein the first second and third conductive layers respectively further include:

the gate electrode, a first portion of the drain electrode, and a second portion of the drain electrode, or the first portion of the drain electrode, the second portion of the drain electrode, and a third portion of the drain electrode, and within the pad electrode of the pad area, the second sub-pad and the third sub-pad are in direct contact with each other without the second insulating layer therebetween.

2. The display device of claim 1, wherein within the pad electrode, the third sub-pad completely covers top and side surfaces of the second sub-pad.

3. The display device of claim 1, wherein within the pad electrode, a first contact area is defined where the first sub-pad and the second sub-pad are in direct contact with each other, a second contact area is defined where the second sub-pad and the third sub-pad are in direct contact with each other, and the second contact area overlaps the first contact area.

4. The display device of claim 1, wherein within the pad electrode, each of the third sub-pad and the second sub-pad has a planar area, and the planar area of the third sub-pad is larger than the planar area of the second sub-pad.

5. The display device of claim 4, wherein within the pad electrode, each of the third sub-pad and the second sub-pad has a maximum length in a direction along the substrate, and the maximum length of the third sub-pad is larger than the maximum length of the second sub-pad.

6. The display device of claim 1, wherein within the pad electrode, each of the first sub-pad, the second sub-pad and the third sub-pad has a thickness, and the thicknesses of the second sub-pad and the third sub-pad are greater than the thickness of the first sub-pad.

7. The display device of claim 1, further comprising:

the pad electrode further including a fourth sub-pad which is on the third sub-pad, electrically connected to the third sub-pad, and overlaps the first to third sub-pads;

a fifth conductive layer between the third insulating layer and the fourth conductive layer, the fifth conductive layer including the fourth sub-pad of the pad electrode; and a fourth insulating layer between the fifth conductive layer and the fourth conductive layer, wherein the first, second, third and fifth conductive lavers respectively further include the gate electrode, the first portion of the drain electrode, the second portion of the drain electrode, and the third portion of the drain electrode, and within the pad electrode, the second to fourth sub-pads are respectively in direct contact with each other without the second insulating layer and the third insulating layer therebetween.

8. The display device of claim 7, wherein within the pad electrode, the fourth sub-pad completely covers top and side surfaces of the third sub-pad.

9. The display device of claim 7, wherein a first contact area is defined where the first sub-pad and the second sub-pad are in direct contact with each other, a second contact area is defined where the second to fourth sub-pads are respectively in direct contact with each other, and the first contact area overlaps the second contact area.

10. The display device of claim 7, wherein a thickness of the fourth sub-pad is greater than a thickness of the first sub-pad.

11. The display device of claim 1, wherein the display area further comprises a first touch electrode of a touch sensor; and the pad electrode of the pad area further includes a first pad layer which is on the third sub-pad, overlaps the first to third sub-pads, and is electrically connected to the third sub-pad;

further comprising in order in a direction away from the substrate:

the fourth conductive layer;

a fifth insulating layer; and a sixth conductive layer including the first touch electrode of the touch sensor and the first pad layer of the pad electrode;

wherein within the pad electrode of the pad area:

a first contact area is defined where the first sub-pad and the second sub-pad are in direct contact with each other, a second contact area is defined where the first pad layer is in direct contact with the third sub-pad without the fifth insulating layer therebetween, and the first contact area overlaps the second contact area.

12. The display device of claim 11, wherein each of the first pad layer, the third sub-pad and the second sub-pad has a planar area, and the planar area of the first pad layer is smaller than the planar area of the third sub-pad and is larger than the planar area of the second sub-pad.

13. The display device of claim 12, wherein each of the first pad layer, the third sub-pad and the second sub-pad has a maximum length in a direction along the substrate, and the maximum length of the first pad layer is smaller than the maximum length of the third sub-pad and larger than the maximum length of the second sub-pad.

14. The display device of claim 11, wherein the pad electrode of the pad area further includes:

a second pad layer between the first pad layer and the third sub-pad, the fifth insulating layer including the second pad layer, and the second pad layer is in an area other than the first contact area where the first sub-pad and the second sub-pad are in direct contact with each other.

15. The display device of claim 14, wherein the pad electrode of the pad area further includes a third pad layer on the first pad layer;

further comprising in order in the direction away from the substrate:

the sixth conductive layer, and a sixth insulating layer including the third pad layer of the pad electrode wherein the third pad layer is in an area other than the first contact area where the first sub-pad and the second sub-pad are in direct contact with each other.

16. The display device of claim 15, wherein the display area further comprises a second touch electrode of the touch sensor;

the pad electrode of the pad area further includes a fourth pad layer which is on the third pad layer and electrically connected to the first pad layer;

further comprising in order in the direction away from the substrate:

the sixth insulating layer, and a seventh conductive layer including the second touch electrode of the touch sensor and the fourth pad layer of the pad electrode;

wherein a third contact area is defined where the fourth pad layer is in direct contact with the first pad layer without the sixth insulating layer therebetween, and the third contact area overlaps the first contact area where the first sub-pad and the second sub-pad are in direct contact with each other.

17. A display device comprising:

a substrate comprising a display area, and a pad area which is adjacent to the display area and comprises a pad electrode;

the pad electrode of the pad area comprising a first sub-pad, a second sub-pad and a third sub-pad which overlap each other and are electrically connected to each other;

a semiconductor layer in the display area;

a gate insulating layer on the semiconductor layer, the gate insulating layer in the display area and in the pad area;

a first conductive layer on the gate insulating layer, the first conductive layer including a gate electrode in the display area, and the first sub-pad of the pad electrode;

an interlayer insulating layer on the gate electrode and the first sub-pad;

a second conductive layer on the interlayer insulating layer, the second conductive layer including a first connection electrode which is in the display area and connected to the semiconductor layer, and the second sub-pad of the pad electrode which is on the first sub-pad;

a first passivation layer on the first connection electrode, in the display area;

a third conductive layer on the first passivation layer, the third conductive layer including a second connection electrode which is in the display area and connected to the first connection electrode, and the third sub-pad of the pad electrode which is on the second sub-pad;

a second passivation layer on the second connection electrode, in the display area; and a light emitting element on the second passivation layer, in the display area, wherein within the pad electrode of the pad area, the second sub-pad and the third sub-pad are in direct contact with each other without the first passivation layer therebetween.

18. The display device of claim 17, wherein within the pad electrode, the third sub-pad completely covers top and side surfaces of the second sub-pad.

19. The display device of claim 17, wherein within the pad electrode, a first contact area is defined where the first sub-pad and the second sub-pad are in direct contact with each other, a second contact area is defined where the second sub-pad and the third sub-pad are in direct contact with each other, and the second contact area overlaps the first contact area.

20. The display device of claim 17, further comprising:

a touch layer of a touch sensor which is on the light emitting element and includes a touch electrode;

the pad electrode of the pad area further comprising a first pad layer which is on the third sub-pad, overlaps the first to third sub-pads and is electrically connected to the third sub-pad; and a fourth conductive layer including the touch electrode and the first pad layer, wherein a first contact area is defined where the first sub-pad and the second sub-pad are in direct contact with each other, a second contact area is defined where the first pad layer and the third sub-pad are in direct contact with each other, and the second contact area overlaps the first contact area.

* * * * *